United States Patent
Seo et al.

(10) Patent No.: US 11,887,957 B2
(45) Date of Patent: Jan. 30, 2024

(54) SEMICONDUCTOR DEVICE

(71) Applicant: Samsung Electronics Co., Ltd., Suwon-si (KR)

(72) Inventors: Jubin Seo, Seongnam-si (KR); Sujeong Park, Hwaseong-si (KR); Kwangjin Moon, Hwaseong-si (KR); Myungjoo Park, Pohang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 18/076,529

(22) Filed: Dec. 7, 2022

(65) Prior Publication Data

US 2023/0108516 A1 Apr. 6, 2023

Related U.S. Application Data

(63) Continuation of application No. 17/108,140, filed on Dec. 1, 2020, now Pat. No. 11,538,782.

(30) Foreign Application Priority Data

Apr. 9, 2020 (KR) .......................... 10-2020-0043334

(51) Int. Cl.
*H01L 23/00* (2006.01)

(52) U.S. Cl.
CPC .............. *H01L 24/13* (2013.01); *H01L 24/05* (2013.01); *H01L 2224/0401* (2013.01); *H01L 2224/05001* (2013.01); *H01L 2224/13099* (2013.01); *H01L 2924/014* (2013.01); *H01L 2924/3651* (2013.01)

(58) Field of Classification Search
CPC ........................................................ H01L 24/13
See application file for complete search history.

(56) References Cited

U.S. PATENT DOCUMENTS

| 7,456,090 | B2 * | 11/2008 | Chang ..................... H01L 24/05 |
| | | | 257/E23.021 |
| 7,541,272 | B2 | 6/2009 | Daubenspeck et al. |
| 8,039,762 | B2 | 10/2011 | Kang |
| 8,298,930 | B2 | 10/2012 | Arvin et al. |
| 8,318,596 | B2 * | 11/2012 | Kuo ........................ H01L 24/11 |
| | | | 257/737 |

(Continued)

FOREIGN PATENT DOCUMENTS

| KR | 100639703 B1 | 10/2006 |
| KR | 101009110 B1 | 1/2011 |

(Continued)

*Primary Examiner* — William A Harriston
(74) *Attorney, Agent, or Firm* — Muir Patent Law, PLLC

(57) ABSTRACT

Disclosed is a semiconductor device comprising a semiconductor substrate, an under-bump pattern on the semiconductor substrate and including a first metal, a bump pattern on the under-bump pattern, and an organic dielectric layer on the semiconductor substrate and in contact with a sidewall of the bump pattern. The bump pattern includes a support pattern in contact with the under-bump pattern and having a first width, and a solder pillar pattern on the support pattern and having a second width. The first width is greater than the second width. The support pattern includes at least one of a solder material and an intermetallic compound (IMC). The intermetallic compound includes the first metal and the solder material.

20 Claims, 23 Drawing Sheets

(56) References Cited

U.S. PATENT DOCUMENTS

| | | | |
|---|---|---|---|
| 8,598,030 B2 | 12/2013 | Kuo et al. | |
| 8,803,319 B2 * | 8/2014 | Kuo | H01L 23/5329 257/757 |
| 9,105,530 B2 * | 8/2015 | Lin | H01L 24/13 |
| 9,324,671 B2 | 4/2016 | Zhang | |
| 9,391,036 B2 | 7/2016 | Matsumoto et al. | |
| 9,425,136 B2 * | 8/2016 | Kuo | H01L 24/13 |
| 9,449,931 B2 | 9/2016 | Lin et al. | |
| 9,842,825 B2 | 12/2017 | Huang et al. | |
| 2008/0157362 A1 * | 7/2008 | Chang | H01L 24/13 257/E23.021 |
| 2011/0001250 A1 * | 1/2011 | Lin | H01L 24/81 427/97.1 |
| 2011/0186986 A1 * | 8/2011 | Chuang | H01L 23/498 257/737 |
| 2011/0285011 A1 * | 11/2011 | Hwang | H01L 24/11 257/737 |
| 2012/0018878 A1 * | 1/2012 | Cheng | H01L 21/4853 257/737 |
| 2012/0091577 A1 * | 4/2012 | Hwang | H01L 24/11 257/E21.477 |
| 2014/0329382 A1 | 11/2014 | Hwang et al. | |
| 2014/0361431 A1 * | 12/2014 | Matsumoto | H01L 24/11 257/737 |
| 2020/0105702 A1 | 4/2020 | Lee et al. | |

FOREIGN PATENT DOCUMENTS

| | | |
|---|---|---|
| KR | 101221257 B1 | 1/2013 |
| KR | 1020140130915 A | 11/2014 |
| KR | 1020200036981 A | 4/2020 |

\* cited by examiner

SEMICONDUCTOR DEVICE

CROSS-REFERENCE TO RELATED APPLICATION

This U.S. nonprovisional application is a continuation of and claims priority to U.S. patent application Ser. No. 17/108,140 filed on Dec. 1, 2020, which claims priority under 35 U.S.C § 119 to Korean Patent Application No. 10-2020-0043334 filed on Apr. 9, 2020 in the Korean Intellectual Property Office, the disclosure of which is hereby incorporated by reference in its entirety.

BACKGROUND

The present inventive concepts relate to a semiconductor device, and more particularly, to a semiconductor device including bump patterns.

Semiconductor devices have been rapidly developed to increase the number of electrode terminals and to decrease a pitch between the electrode terminals. Therefore, research has been increasingly conducted on compactness of semiconductor devices. Semiconductor devices generally have electrical connection terminals, such as solder balls or bumps, for electrical connections with other electronic devices or printed circuit boards. Semiconductor devices require fine pitches between the electrical connection terminals thereof.

SUMMARY

Some example embodiments of the present inventive concepts provide a semiconductor device including bump patterns with fine pitch.

According to some example embodiments of the present inventive concepts, a semiconductor device may comprise: a semiconductor substrate; an under-bump pattern on the semiconductor substrate and including a first metal; a bump pattern on the under-bump pattern; and an organic dielectric layer on the semiconductor substrate and in contact with a sidewall of the bump pattern. The bump pattern may include: a support pattern in contact with the under-bump pattern and having a first width; and a solder pillar pattern on the support pattern and having a second width. The first width may be greater than the second width. The support pattern may include at least one of a solder material and an intermetallic compound (IMC). The intermetallic compound may include the first metal and the solder material.

According to some example embodiments of the present inventive concepts, a semiconductor device may comprise: a semiconductor substrate; an under-bump pattern on the semiconductor substrate and including a first metal; and a bump pattern on the under-bump pattern. The bump pattern may include: a support pattern in contact with the under-bump pattern and including an intermetallic compound of a second metal or of the first metal and the second metal; and a pillar pattern directly on the support pattern and including the second metal. The second metal may be different from the first metal. A width of the support pattern may be greater than a width of the pillar pattern.

According to some example embodiments of the present inventive concepts, a semiconductor device may comprise: a semiconductor substrate; a circuit layer on the semiconductor substrate, the circuit layer including an integrated circuit on a first surface of the semiconductor substrate, a dielectric pattern that covers the integrated circuit, a conductive structure in the dielectric pattern and coupled to the integrated circuit, and a terminal pad coupled to the conductive structure; a plurality of under-bump patterns on the circuit layer and including a first metal; a protective layer on the circuit layer and covering a sidewall of the under-bump pattern; a plurality of bump patterns on corresponding ones of the plurality of under-bump patterns, respectively; and an organic dielectric layer on the protective layer and covering sidewalls of the bump patterns. Each of the bump patterns may include: a support pattern in contact with one of the under-bump patterns and having a first width; and a solder pillar pattern connected to the support pattern and having a second width. The first width may be greater than the second width. The first width may be the same as or less than a width of the under-bump pattern. The solder pillar pattern may include a second metal different from the first metal. The support pattern may include at least one of the second metal and an intermetallic compound. The intermetallic compound may include the first metal and the second metal.

DETAILED DESCRIPTION OF EMBODIMENTS

Figure 1A:
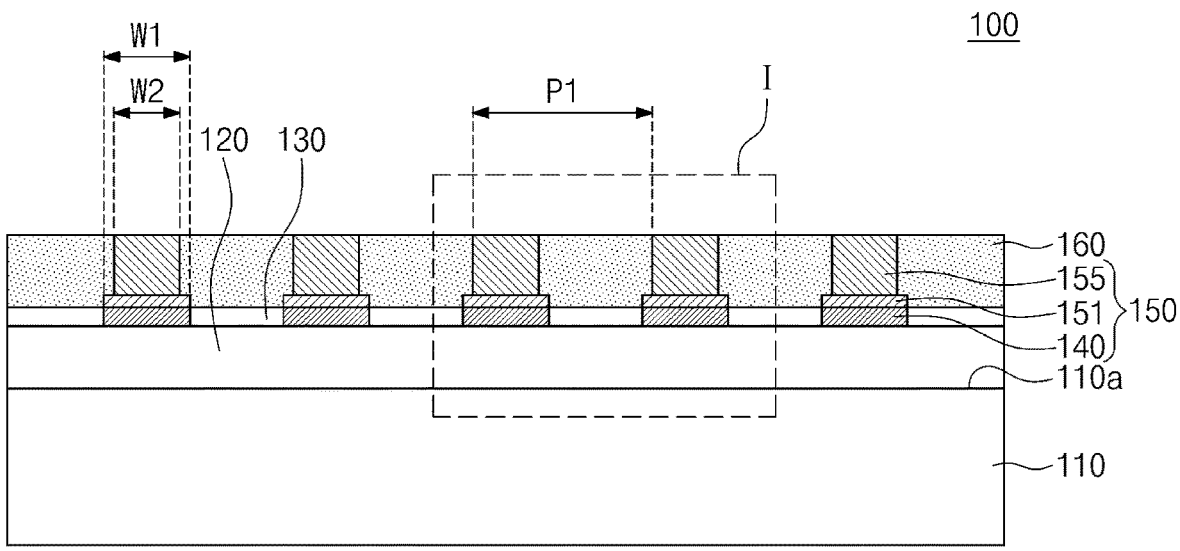
FIG. 1A illustrates a cross-sectional view showing a semiconductor device according to some example embodiments.

In this description, like reference numerals may indicate like components. In this description, width of certain components may be values measured in a first direction, and the first direction may be parallel to a first surface of a substrate. In comparison with widths between two some components, the widths may be measured in the first direction. A semiconductor apparatus may indicate a semiconductor device or a semiconductor package. The following will now describe a semiconductor device and its fabrication method according to the present inventive concepts.

Figure 1B:
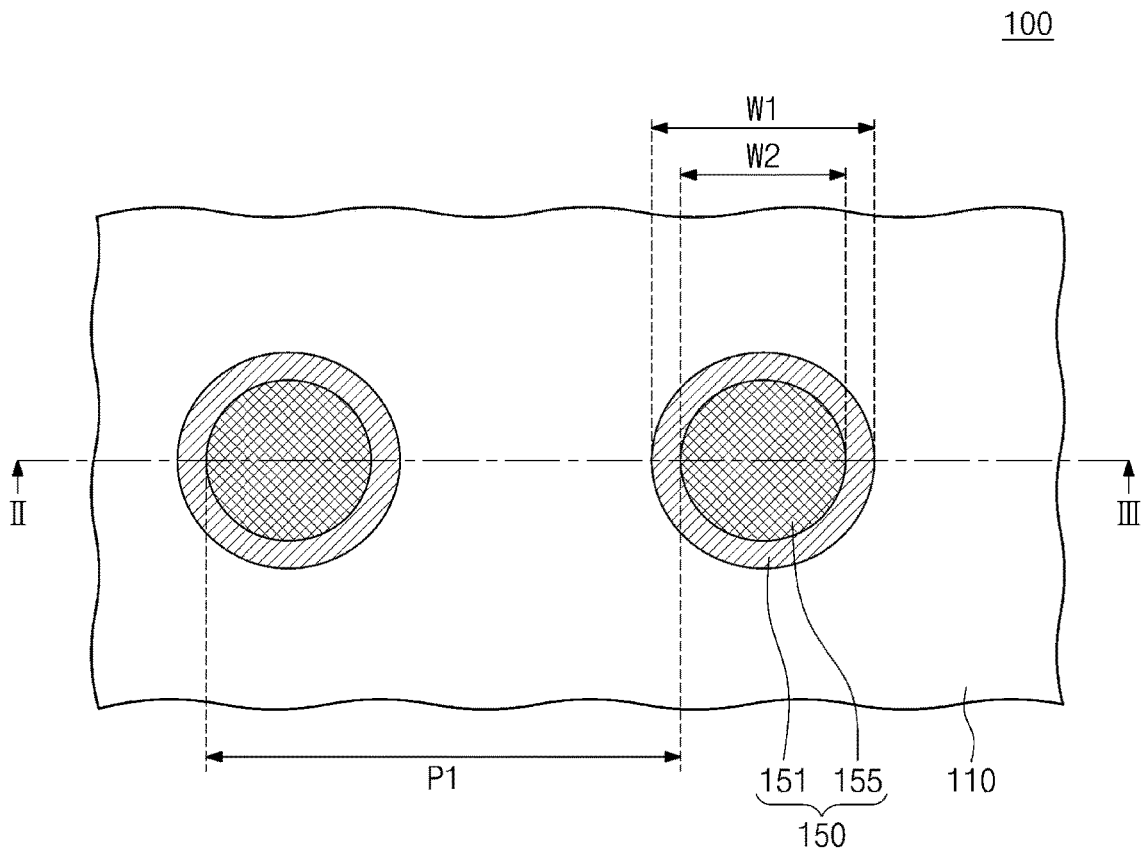
FIG. 1B illustrates a plan view showing a bump pattern of a semiconductor device according to some example embodiments.
Figure 1C:
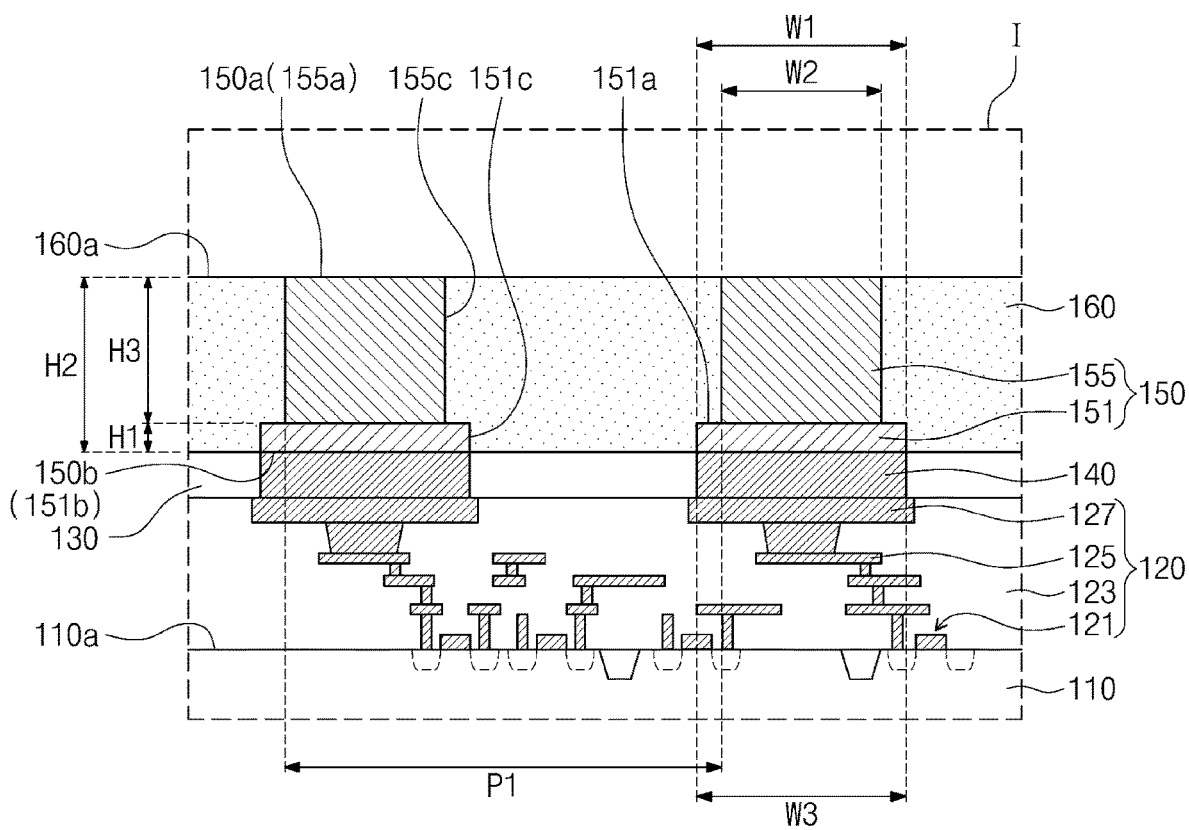
FIG. 1C illustrates an enlarged cross-sectional view of section I of FIG. 1A taken along line II-III of FIG. 1B.

FIG. 1A illustrates a cross-sectional view showing a semiconductor device according to some example embodiments. FIG. 1B illustrates a plan view showing a bump pattern of a semiconductor device according to some example embodiments. FIG. 1C illustrates an enlarged cross-sectional view of section I of FIG. 1A taken along line II-III of FIG. 1B.

Referring to FIGS. 1A, 1B, and 1C, a semiconductor device 100 may include a substrate, a circuit layer 120, a protective layer 130, an under-bump pattern 140, and a bump pattern 150. The semiconductor device 100 may be a memory chip, a logic chip, or a buffer chip. The substrate may be a semiconductor substrate 110. The semiconductor substrate 110 may include a semiconductor material, such as silicon, germanium, or silicon-germanium.

The circuit layer 120 may be provided on a first surface 110a of the semiconductor substrate 110. As shown in FIG. 1C, the circuit layer 120 may include an integrated circuit 121, a dielectric layer 123, a connection line structure 125, and a terminal pad 127. The integrated circuit 121 may be provided on the first surface 110a of the semiconductor substrate 110. The integrated circuit 121 may include, for example, transistors. The dielectric layer 123 may be provided on the first surface 110a of the semiconductor substrate 110, and may cover the integrated circuit 121. The dielectric layer 123 may include a plurality of layers. The dielectric layer 123 may include or may be formed of a silicon-containing dielectric material. The silicon-containing dielectric material may include, for example, one or more of silicon oxide, silicon nitride, silicon oxynitride, and tetraethyl orthosilicate (TEOS). The connection line structure 125 may be provided in the dielectric layer 123. The connection line structure 125 may be electrically connected to the integrated circuit 121. In this description, the phrase "electrically connected to the semiconductor device 100" may mean "electrically connected to the integrated circuit 121 of the semiconductor device 100." The phrase "electrically connected/coupled" may include "indirectly connected/coupled through other conductive component(s) or "directly connected/coupled." When an element is referred to as being "directly connected/coupled" to another element, or as "contacting" or "in contact with" another element, there are no intervening elements present at the point of contact. The connection line structure 125 may include a line part and a via part connected to the line part. The line part may have a major axis that extends in a direction parallel to the first surface 110a of the semiconductor substrate 110. The via part may have a major axis that extends in a direction that intersects the first surface 110a of the semiconductor substrate 110. The connection line structure 125 may include or may be formed of metal, such as aluminum or copper. The terminal pad 127 may be disposed in or on an uppermost dielectric layer 123 and electrically connected to the connection line structure 125. The terminal pad 127 may be a chip pad. The terminal pad 127 may include or may be formed of metal, such as aluminum.

The under-bump pattern 140 may be provided on the first surface 110a of the semiconductor substrate 110. For example, the under-bump pattern 140 may be provided on the circuit layer 120 and the under-bump pattern 140 may be formed using under bump metallurgy (UBM) deposition. In this description, the phrase "a certain component is on another component" may mean that "the certain component is directly formed on the other component" or "a third component is interposed between the certain component and the other component." The under-bump pattern 140 may be provided on a top surface of the terminal pad 127. The under-bump pattern 140 may be coupled to the integrated circuit 121 through the terminal pad 127 and the connection line structure 125. The under-bump pattern 140 may have a top surface and a bottom surface that face each other. The bottom surface of the under-bump pattern 140 may be directed toward the semiconductor substrate 110 and in contact with the terminal pad 127. Although not shown, a seed pattern may further be interposed between the terminal pad 127 and the under-bump pattern 140. The seed pattern may be used to form the under-bump pattern 140. The under-bump pattern 140 may include or may be formed of a first metal. The first metal may include, for example, copper, aluminum, or tungsten.

The protective layer 130 may be provided on the first surface 110a of the semiconductor substrate 110. The protective layer 130 may cover the circuit layer 120. The protective layer 130 may expose at least a portion of the top surface of the under-bump pattern 140. The protective layer 130 may include or may be formed of a silicon-containing dielectric material, such as one or more of silicon oxide, silicon nitride, and silicon oxynitride. Alternatively, the protective layer 130 may include or may be formed of a dielectric polymer. The protective layer 130 may be a single layer or multiple layers.

The bump pattern 150 may be provided on and coupled to the under-bump pattern 140. The bump pattern 150 may serve as an input/output terminal of the semiconductor device 100. The bump pattern 150 may include a support pattern 151 and a solder pillar pattern 155. The bump pattern 150 may have a first surface 150a and a second surface 150b that face each other. The first surface 150a of the bump pattern 150 may correspond to a top surface 155a of the solder pillar pattern 155. The second surface 150b of the bump pattern 150 may correspond to a bottom surface 151b of the support pattern 151. The support pattern 151 may be directly disposed on the top surface of the under-bump pattern 140. For example, the bottom surface 151b of the support pattern 151 may contact the top surface of the under-bump pattern 140. No component, such as a seed pattern, may be provided between the support pattern 151 and the under-bump pattern 140. The support pattern 151 may have a first width W1. The first width W1 of the support pattern 151 may indicate a width at the bottom surface 151b of the support pattern 151. The first width W1 may be the same as or less than a width W3 of the under-bump pattern 140. For example, the first width W1 may range from about 5 µm to about 10 µm. The width W3 of the under-bump pattern 140 may range from about 5 µm to about 10 µm. When the first width W1 is greater than the width W3 of the under-bump pattern 140, the support pattern 151 may physically contact the protective layer 130. In this case, when the semiconductor device 100 operates repeatedly, there may be the occurrence of leakage current from the bump pattern 150. According to some example embodiments, as the first width W1 is the same as or less than the width W3 of the under-bump pattern 140, the support pattern 151 may become spaced apart from the protective layer 130. Therefore, the bump pattern 150 may increase in reliability.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The solder pillar pattern 155 may be provided on and directly connected to the support pattern 151. The solder pillar pattern 155 may have a second width W2. The second width W2 of the solder pillar pattern 155 may indicate a width of the solder pillar pattern 155 at an arbitrary level. Unless defined otherwise, the level may be a height measured in a direction perpendicular to the first surface 110a of the semiconductor substrate 110. The second width W2 may be less than the first width W1. For example, the second width W2 may range from about 3 µm to about 9 µm. For example, a difference between the first width W1 and the second width W2 may range from about 0.5 µm to about 2.5 µm. As the first width W1 is greater than the second width W2, an increased contact area may be provided between the under-bump pattern 140 and the bump pattern 150. The contact area between the under-bump pattern 140 and the bump pattern 150 may correspond to a contact area between the bottom surface 151b of the support pattern 151 and the top surface of the under-bump pattern 140. Therefore, an increased adhesive force may be provided between the under-bump pattern 140 and the bump pattern 150. According to some example embodiments, when the difference between the first width W1 and the second width W2 is less than about 0.5 µm or greater than about 2.5 µm, an insufficient contact area may be present between the under-bump pattern 140 and the bump pattern 150 or the solder pillar pattern 155 may have an excessively large size. According to some example embodiments, as the difference between the first width W1 and the second width W2 falls within a range of about 0.5 µm to about 2.5 µm, an increased adhesive force may be provided between the under-bump pattern 140 and the bump pattern 150 and the solder pillar pattern 155 may have a fine size. The second width W2 may be relatively uniform regardless of level of the solder pillar pattern 155. The solder pillar pattern 155 may have a rectangular shape when viewed in cross-section. The second width W2 may be about 80% to about 120% of a height H3 of the solder pillar pattern 155. For example, a minimum value of the second width W2 may be about 80% to about 120% of the height H3 of the solder pillar pattern 155. A maximum value of the second width W2 may be about 80% to about 120% of the height H3 of the solder pillar pattern 155.

The solder pillar pattern 155 may include or may be formed of a second metal different from the first metal. The second metal may include or may be formed of a solder material. The second metal may include, for example, one or more of tin (Sn), silver (Ag), and an alloy thereof.

The support pattern 151 may be an intermetallic compound layer. The support pattern 151 may include an intermetallic compound (IMC) of the first and second metals. The intermetallic compound may be an alloy in which the first metal and the second metal are combined with each other at a specific stoichiometric ratio. The intermetallic compound may have physical/chemical characteristics different from those of each of the first metal and the second metal. As the support pattern 151 includes the intermetallic compound, the bump pattern 150 may be rigidly fixed to the under-bump pattern 140. The semiconductor device 100 may have increased reliability. As the support pattern 151 includes the intermetallic compound, no adhesive layer may be separately required between the bump pattern 150 and the under-bump pattern 140. The adhesive layer may include or may be formed of a titanium-containing layer. Therefore, the bottom surface 151b of the support pattern 151 may contact the top surface of the under-bump pattern 140. The support pattern 151 may be formed of a different material from that of the under-bump pattern 140, and the different material may be the second metal or the intermetallic compound discussed above.

When the support pattern 151 has a height H1 less than about 0.1 the under-bump pattern 140 and the bump pattern 150 may have a relatively low adhesive force therebetween. When the height H1 of the support pattern 151 is greater than about 0.5 the bump pattern 150 may be difficult to have a fine size. According to some example embodiments, the height H1 of the support pattern 151 may range from about 0.1 µm to about 0.5 µm. The under-bump pattern 140 and the bump pattern 150 may have an increased adhesive force therebetween, and the bump pattern 150 may have a fine size. The bump pattern 150 may have a height H2 of, for example, about 5 µm to about 15 µm. The height H3 of the solder pillar pattern 155 may range from about 4.5 µm to about 14.9 µm.

The bump pattern 150 may be provided in plural. The plurality of bump patterns 150 may include their solder pillar patterns 155 having a first pitch P1 therebetween. The first pitch P1 may be a period at which the solder pillar patterns 155 are arranged repeatedly. For example, the first pitch P1 may be an interval between first sidewalls of two neighboring solder pillar patterns 155. The first sidewalls of the solder pillar patterns 155 may be directed toward a first direction. The first pitch P1 may be relatively small. For example, the first pitch P1 may range from about 5 µm to about 25 µm. More narrowly, the first pitch P1 may range from about 10 µm to about 20 µm. When the solder pillar patterns 155 have a pitch of less than about 5 µm, it may be difficult to couple the solder pillar patterns 155 to other conductive components in a soldering process. When the solder pillar patterns 155 have a pitch of greater than about 25 µm, it may be difficult to achieve small sizes or high densities of semiconductor devices. According to some example embodiments, as the first pitch P1 ranges from about 5 µm to about 25 µm, it may be possible to accomplish compactness of the semiconductor device 100. Moreover, the number of input/output terminals may be increased to allow the semiconductor device 100 to have a high density. The following will discuss a single bump pattern 150.

An organic dielectric layer 160 may be provided on the first surface 110a of the semiconductor substrate 110. For example, the organic dielectric layer 160 may cover the protective layer 130. The smaller the size of the support pattern 151, the lower durability of the support pattern 151.

According to some example embodiments, the organic dielectric layer 160 may contact a top surface 151a at an edge of the support pattern 151, a sidewall 151c of the support pattern 151, and a sidewall 155c of the solder pillar pattern 155. When viewed in plan, the edge of the support pattern 151 may be interposed between a central portion of the support pattern 151 and the sidewall 151c of the support pattern 151. The organic dielectric layer 160 may surround the solder pillar pattern 155, and thus the solder pillar pattern 155 may be prevented from being damaged and deformed. Therefore, even though the solder pillar pattern 155 has the second width W2 that is relatively small, the solder pillar pattern 155 may be free of damage. The organic dielectric layer 160 may be a single homogenous layer. The organic dielectric layer 160 may be a polymeric layer. For example, the organic dielectric layer 160 may be a dielectric polymer. The organic dielectric layer 160 may be a non-conductive film (NCF). The organic dielectric layer 160 may expose the top surface 155a of the solder pillar pattern 155. The organic dielectric layer 160 may have a top surface 160a at substantially the same level as that of the top surface 155a of the solder pillar pattern 155. The top surface 155a of the solder pillar pattern 155, or the first surface 150a of the bump pattern 150 may be a contact surface. For example, the top surface 155a of the solder pillar pattern 155 may contact other conductive components in a soldering process which will be discussed below.

Differently from that shown, the circuit layer 120 may be provided on a second surface of the semiconductor substrate 110. The second surface of the semiconductor substrate 110 may face the first surface 110a. In this case, the semiconductor substrate 110 may further have therein a through electrode (not shown) in contact with the connection line structure 125 and the under-bump pattern 140. The under-bump pattern 140 may be electrically connected to the integrated circuit 121 through the connection line structure 125 and the through via. For brevity of illustration, the following figures except for FIG. 1C omit the dielectric layer 123, the integrated circuit 121, the connection line structure 125, and the terminal pad 127.

Figure 1D:
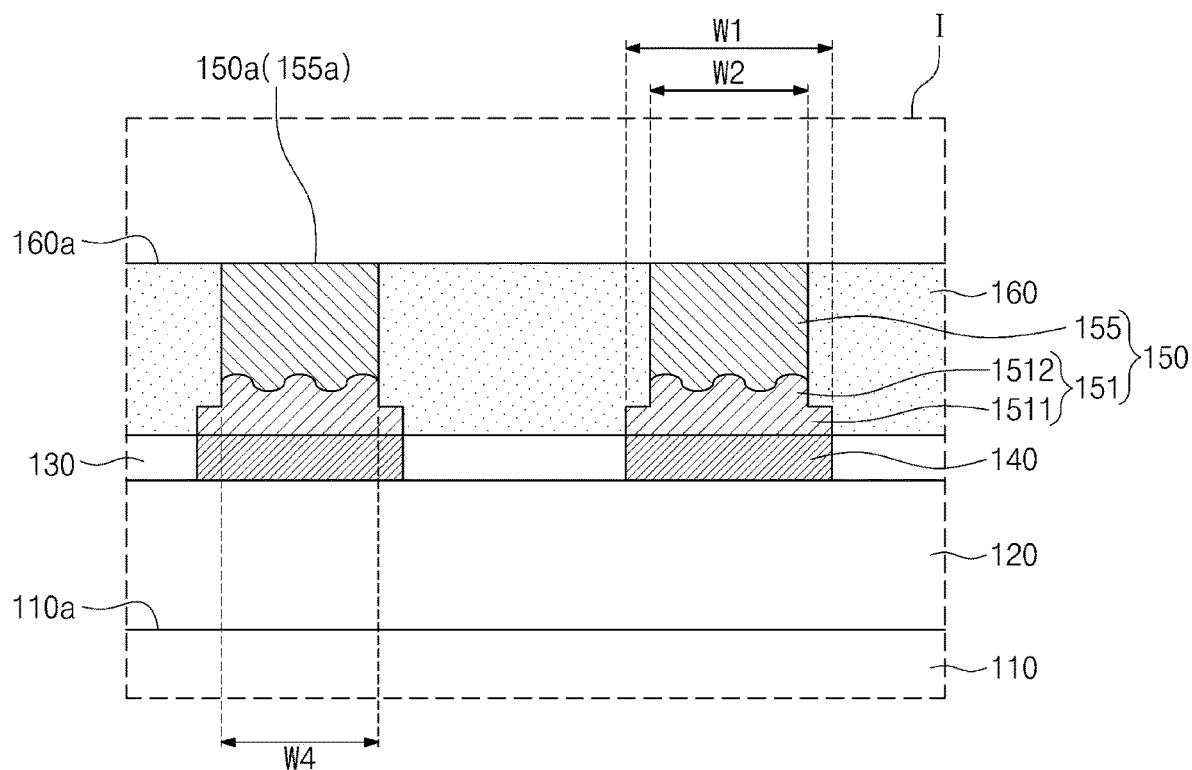
FIG. 1D illustrates an enlarged cross-sectional view of section I of FIG. 1A taken along line II-III of FIG. 1B.

FIG. 1D illustrates an enlarged cross-sectional view of section I of FIG. 1A taken along line II-III of FIG. 1B, showing a semiconductor device according to some example embodiments. A description of FIG. 1D below will also refer to FIGS. 1A and 1B, and a repetitive explanation will be omitted.

Referring to FIG. 1D, a semiconductor device may include the semiconductor substrate 110, the circuit layer 120, the protective layer 130, the under-bump pattern 140, and the bump pattern 150. The semiconductor substrate 110, the circuit layer 120, the protective layer 130, the under-bump pattern 140, and the bump pattern 150 may be substantially the same as those discussed above with reference to FIGS. 1A and 1B. For example, the bump pattern 150 may include the support pattern 151 and the solder pillar pattern 155.

In contrast, the support pattern 151 may include a first part 1511 and a second part 1512. The first part 1511 of the support pattern 151 may be substantially the same as the support pattern 151 discussed above with reference to FIG. 1C. For example, the support pattern 151 may have the first width W1. The second part 1512 of the support pattern 151 may be provided on the first part 1511. The second part 1512 of the support pattern 151 may include or may be formed of the same material as that of the first part 1511. For example, the second part 1512 may include or may be formed of an intermetallic compound of the first and second metals. The second part 1512 of the support pattern 151 may be connected to the first part 1511 with no boundary therebetween. The second part 1512 of the support pattern 151 may have a width W4 less than the first width W1. The width W4 of the second part 1512 may be the same as or less than the second width W2.

FIGS. 2A to 2G illustrate enlarged cross-sectional views of section I of FIG. 1A taken along line II-III of FIG. 1B, showing a method of fabricating a semiconductor device according to some example embodiments. A duplicate description will be omitted below.

Figure 2A:
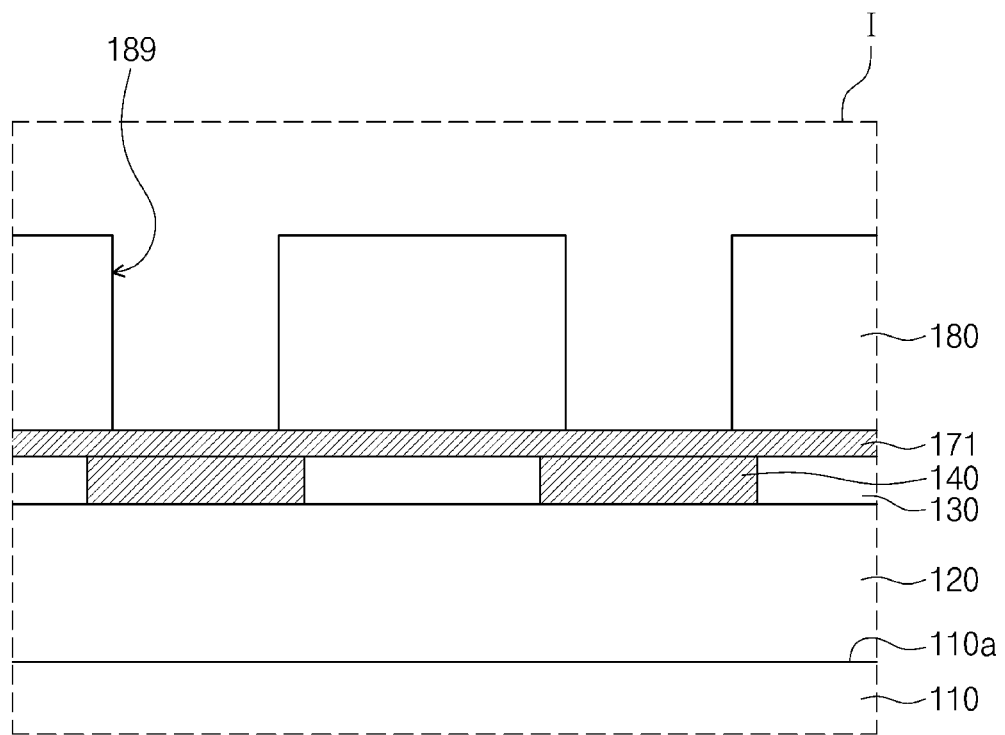
FIGS. 2A to 2G illustrate cross-sectional views showing a method of fabricating a semiconductor device according to some example embodiments.

Referring to FIG. 2A, a circuit layer 120, an under-bump pattern 140, and a protective layer 130 may be formed on a first surface 110a of a semiconductor substrate 110. The semiconductor substrate 110, the circuit layer 120, the protective layer 130, and the under-bump pattern 140 may be substantially the same as those discussed above with reference to FIGS. 1A to 1C.

A first seed layer 171 may be formed on and cover the under-bump pattern 140 and the protective layer 130. The first seed layer 171 may include or may be formed of a first metal. For example, the first seed layer 171 may include or may be formed of the same material as that of the under-bump pattern 140.

A resist pattern 180 may be formed on the first seed layer 171. The resist pattern 180 may include or may be formed of a photoresist material. The resist pattern 180 may have a guide opening 189. The guide opening 189 may expose a top surface of the first seed layer 171. The guide opening 189 may be vertically aligned with the under-bump pattern 140. The guide opening 189 may have a width less than that of the under-bump pattern 140. The width of the guide opening 189 may be substantially uniform. For example, a width of the guide opening 189 at a top surface of the resist pattern 180 may be substantially the same as or similar to a width of the guide opening 189 at a bottom surface of the resist pattern 180.

Figure 2B:
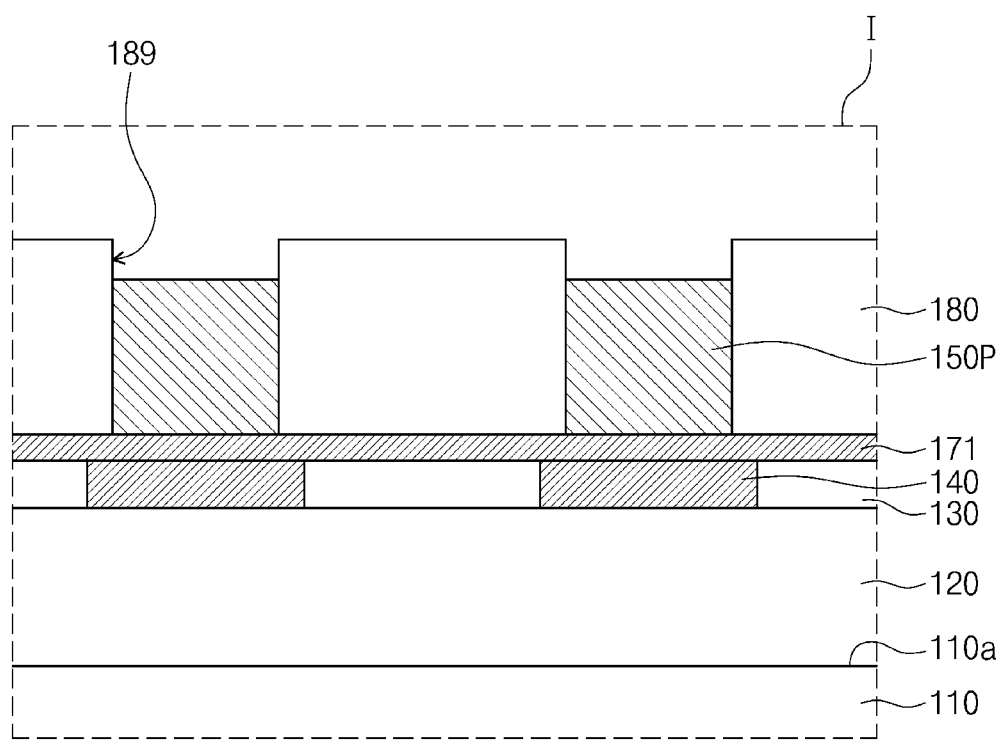

Referring to FIG. 2B, a preliminary bump pattern 150P may be formed in the guide opening 189 and on the exposed top surface of the first seed layer 171. The formation of the preliminary bump pattern 150P may include performing an electroplating process in which the first seed layer 171 is used as an electrode. The preliminary bump pattern 150P may fill the guide opening 189 and may contact the top surface of the first seed layer 171. The preliminary bump pattern 150P may include or may be formed of a second metal.

Figure 2C:
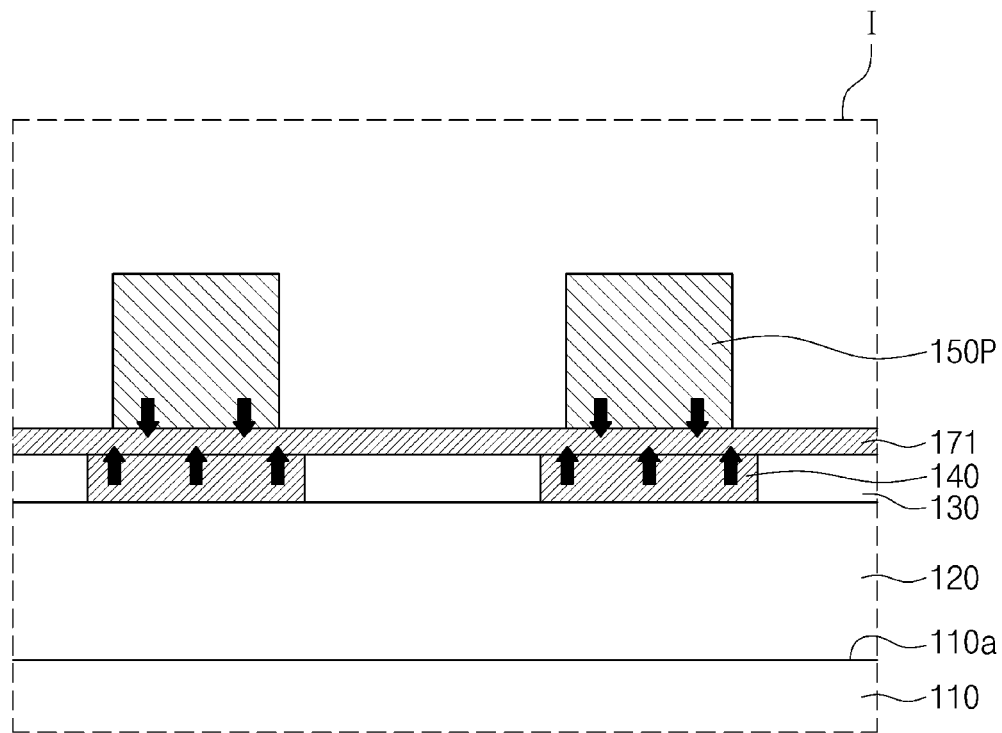
Figure 2D:
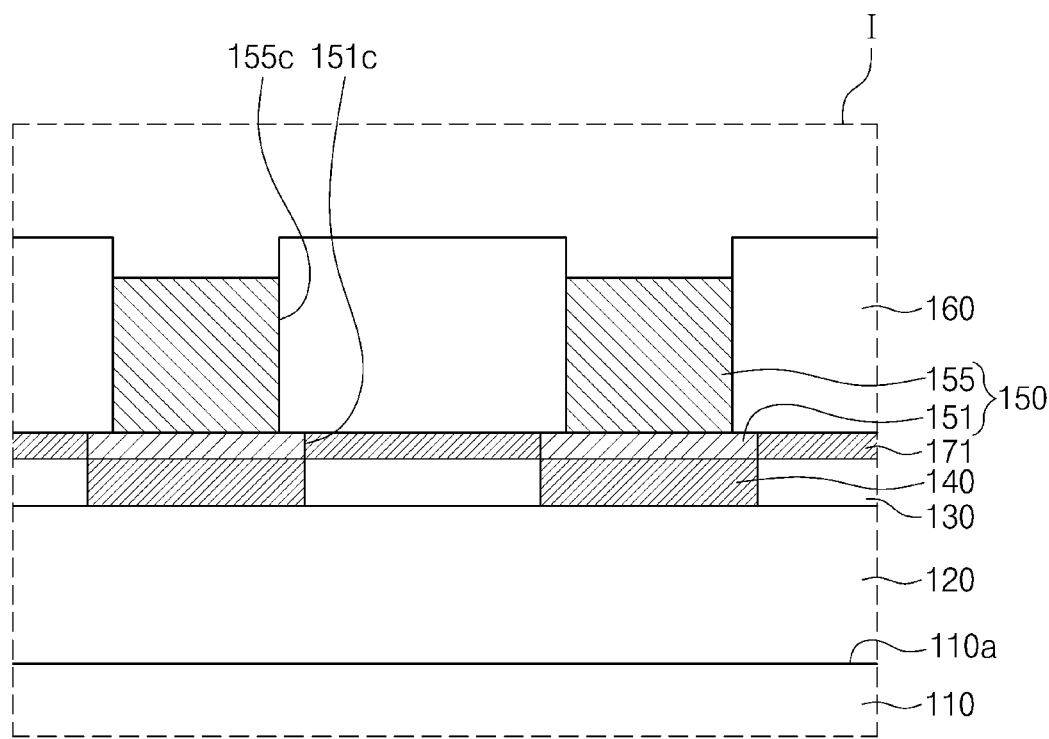

Referring to FIG. 2C, the resist pattern 180 may be removed to expose a sidewall of the preliminary bump pattern 150P. Referring sequentially to FIGS. 2C and 2D, the preliminary bump pattern 150P may undergo an annealing process to form a bump pattern 150. The annealing process may be performed at a temperature ranging from about 160° C. to about 220° C. The annealing process may be executed in which, as indicated by arrows, the second metal may migrate from the preliminary bump pattern 150P into the first seed layer 171. The migrated second metal may combine with the first metal in the first seed layer 171, and thus the first and second metals may form an intermetallic compound. A first portion of the first seed layer 171 may be converted into an intermetallic compound layer. Therefore, a support pattern 151 of FIG. 2D may be formed from the first portion of the first seed layer 171. Accordingly, the support pattern 151 may include or may be formed of an intermetallic compound. A second portion of the first seed layer 171 may form no intermetallic compound. The second portion of the first seed layer 171 may remain between the protective layer 130 and the resist pattern 180.

As indicated by arrows in FIG. 2C, the first metal either in the first seed layer 171 or the under-bump pattern 140 may diffuse into the preliminary bump pattern 150P. The diffused first metal may combine with the second metal in the preliminary bump pattern 150P, and thus the first and second metals may form an intermetallic compound. In this case, the support pattern 151 may have a shape as shown in FIG. 1D.

At least a portion of the preliminary bump pattern 150P shown in FIG. 2C may remain without participating in the formation of intermetallic compounds. After the annealing process terminates, the remaining portion of the preliminary bump pattern 150P may be formed into a solder pillar pattern 155 as shown in FIG. 2D. The solder pillar pattern 155 may include or may be formed of the second metal. The solder pillar pattern 155 may include no intermetallic compound. The solder pillar pattern 155 may be directly connected to the support pattern 151. The support pattern 151 may be provided between the under-bump pattern 140 and the solder pillar pattern 155. The support pattern 151 may not extend onto a top surface of the protective layer 130.

When the annealing process is performed at a temperature of less than about 160° C., it may be difficult to form an intermetallic compound. When the annealing process is performed at a temperature of greater than about 220° C., the bump pattern 150 may be deformed due to its melting. According to some example embodiments, as the annealing process is performed at a temperature ranging from about 160° C. to about 220° C., the bump pattern 150 may be normally formed.

Figure 2E:
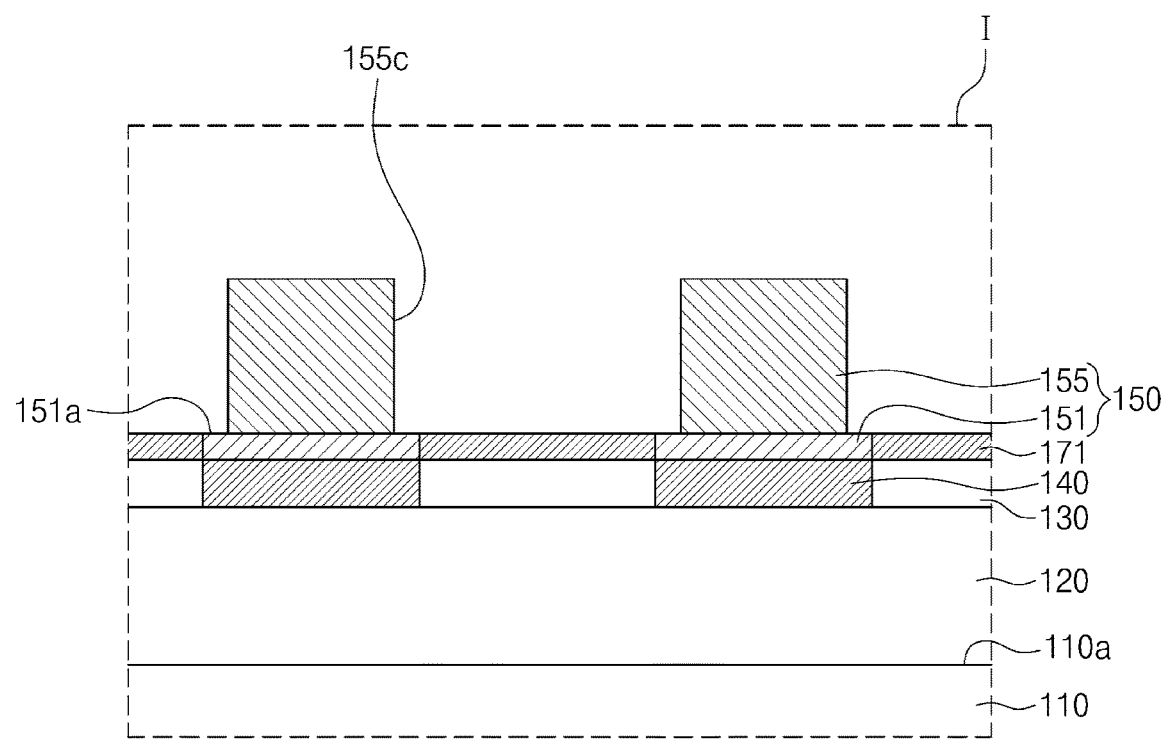

Referring to FIG. 2E, the resist pattern 180 may be removed to expose the top surface of the first seed layer 171, a sidewall 155c of the solder pillar pattern 155, and a top surface 151a at an edge of the support pattern 151.

Figure 2F:
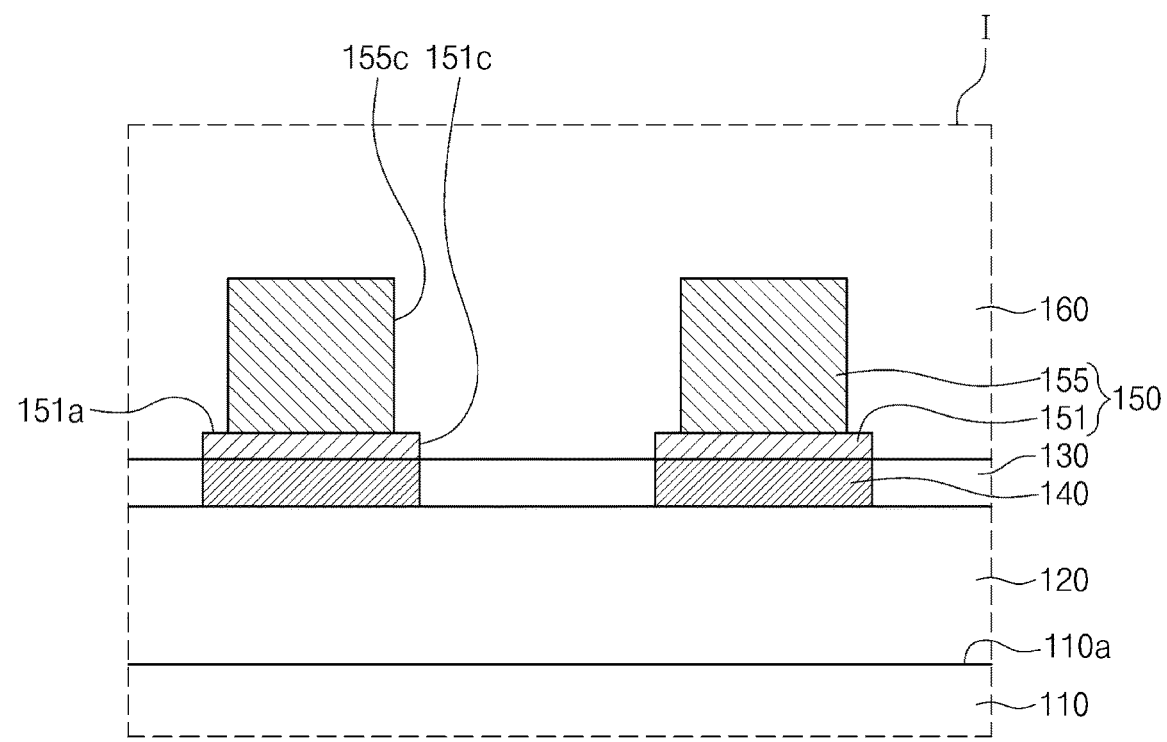

Referring to FIG. 2F, the first seed layer 171 may be removed to expose the top surface of the protective layer 130 and a sidewall 151c of the support pattern 151. An etching process may be performed to remove the first seed layer 171. Because the solder pillar pattern 155 includes the second metal, and because the support pattern 151 includes the intermetallic compound including the second metal, the solder pillar pattern 155 and the support pattern 151 may have an etch selectivity during the etching process. The support pattern 151 may prevent the under-bump pattern 140 from being exposed to the etching process.

Figure 2G:
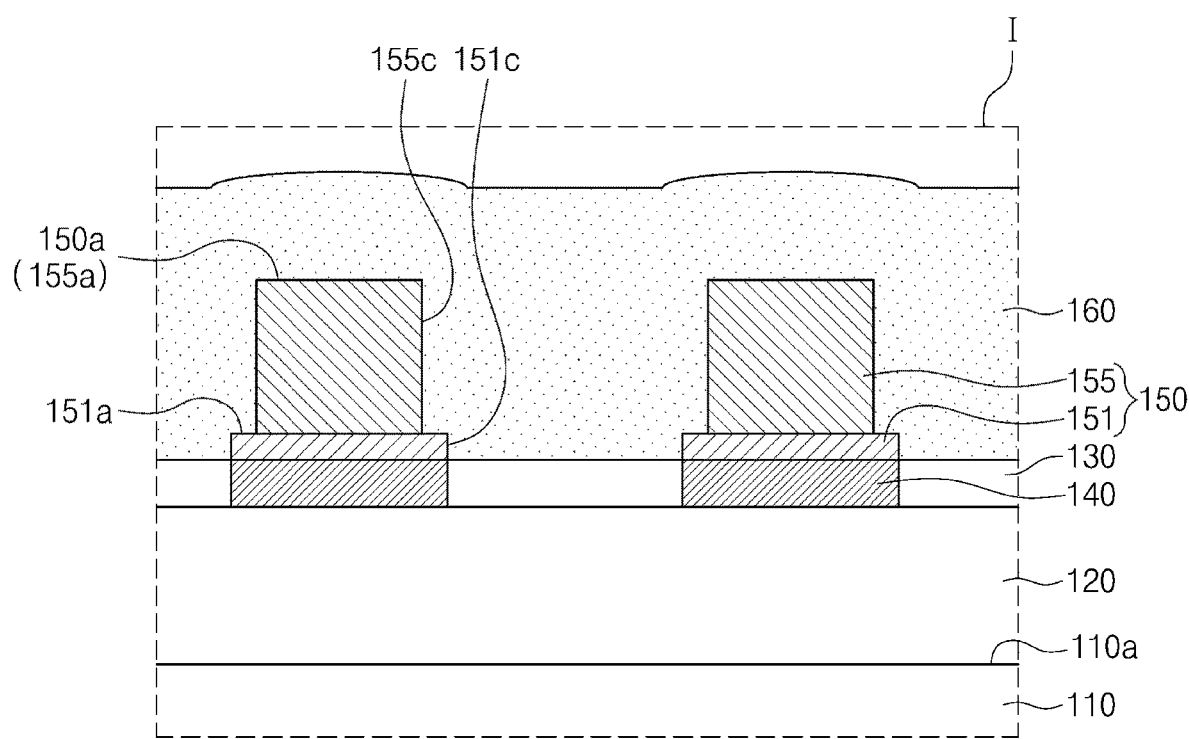

Referring to FIG. 2G, an organic dielectric layer 160 may be formed on the protective layer 130 and the bump pattern 150, and may cover the top surface of the protective layer 130, the sidewall 151c of the support pattern 151, the top surface 151a at the edge of the support pattern 151, the sidewall 155c of the solder pillar pattern 155, and a top surface 155a of the solder pillar pattern 155.

Referring back to FIG. 1C, the organic dielectric layer 160 may undergo a planarization process to expose the top surface 155a of the solder pillar pattern 155. The planarization process may include a grinding process or a fly-cut process. As a result of the planarization process, the top surface 155a of the solder pillar pattern 155 may become coplanar with a top surface 160a of the organic dielectric layer 160. It will be appreciated that "planarization," "coplanar," "planar," etc., as used herein refer to structures (e.g., surfaces) that need not be perfectly geometrically planar, but may include acceptable variances that may result from standard manufacturing processes. According to some example embodiments, the support pattern 151 may stably fix the solder pillar pattern 155 to the under-bump pattern 140. Accordingly, during the planarization process, the solder pillar pattern 155 may be prevented from being separated from the under-bump pattern 140.

Figure 3A:
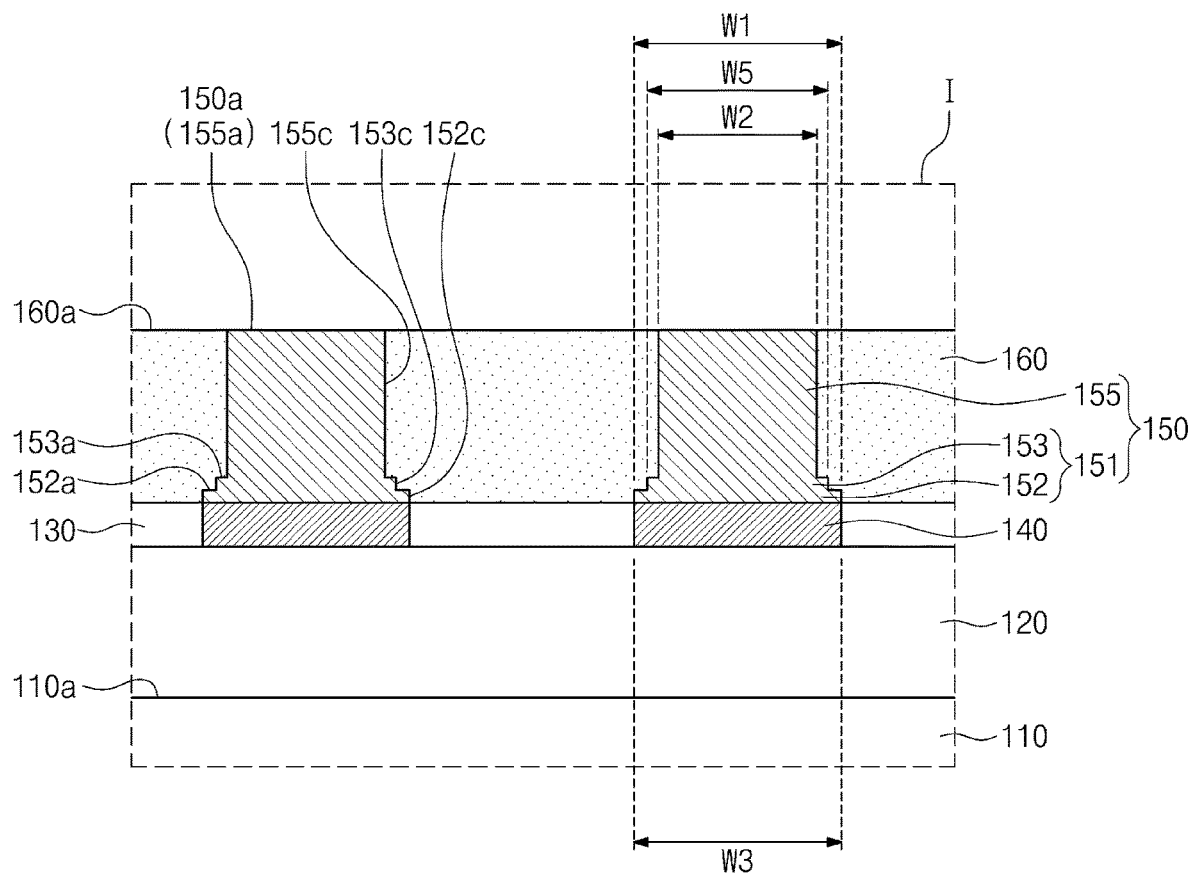
FIG. 3A illustrates a cross-sectional view showing a semiconductor device according to some example embodiments.

FIG. 3A illustrates a cross-sectional view of section I of FIG. 1A taken along line II-III of FIG. 1B, showing a semiconductor device according to some example embodiments. A description of FIG. 3A below will also refer to FIGS. 1A and 1B, and a repetitive explanation will be omitted.

Referring to FIG. 3A, a semiconductor device may include the semiconductor substrate 110, the circuit layer 120, the protective layer 130, the under-bump pattern 140, and the bump pattern 150. The bump pattern 150 may include the support pattern 151 and the solder pillar pattern 155.

The support pattern 151 may include a first supporter 152 and a second supporter 153. The first supporter 152 may contact the under-bump pattern 140. The first width W1 of the support pattern 151 may correspond to a width of the first supporter 152.

The second supporter 153 may be provided on the first supporter 152. The second supporter 153 may have a width W5 less than the first width W1 and greater than the second width W2. The presence of the second supporter 153 may cause the support pattern 151 to have a stepped sidewall. For example, the second supporter 153 may have a sidewall 153c that is not vertically aligned with a sidewall 152c of the first supporter 152. The sidewall 152c of the first supporter 152 and the sidewall 153c of the second supporter 153 may contact the organic dielectric layer 160. The first supporter 152 may have a top surface 152a at an edge thereof, and the second supporter 153 may have a top surface 153a at an edge thereof. The top surfaces 152a and 153a may contact the organic dielectric layer 160. The second supporter 153 may include the same material as that of the first supporter 152, and may be connected to the first supporter 152 with no boundary therebetween. The first and second supporters 152 and 153 may include or may be formed of the second metal. Neither the first supporter 152 nor the second supporter 153 may include an intermetallic compound of the first and second metals, but the present inventive concepts are not limited thereto.

The solder pillar pattern 155 may be substantially the same as the solder pillar pattern 155 discussed above with reference to FIGS. 1A to 1C. In contrast, the solder pillar pattern 155 may include or may be formed of the same material as that of the support pattern 151. The solder pillar pattern 155 may be connected to the second supporter 153 with no boundary therebetween.

Figure 3B:
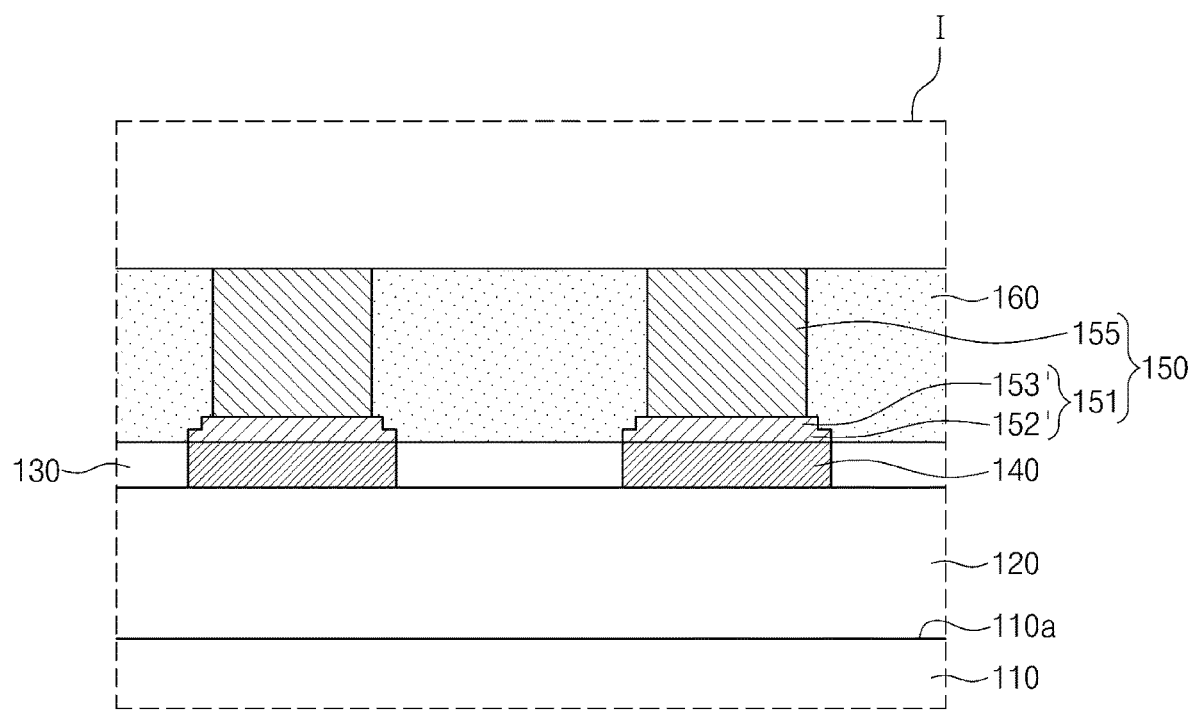
FIG. 3B illustrates a cross-sectional view showing a semiconductor device according to some example embodiments.

FIG. 3B illustrates a cross-sectional view of section I of FIG. 1A taken along line II-III of FIG. 1B, showing a semiconductor device according to some example embodiments. A description of FIG. 3B below will also refer to FIGS. 1A and 1B.

Referring to FIG. 3B, a semiconductor device may include the semiconductor substrate 110, the circuit layer 120, the protective layer 130, the under-bump pattern 140, and the bump pattern 150. The bump pattern 150 may include the support pattern 151 and the solder pillar pattern 155. The solder pillar pattern 155 may be substantially the same as that discussed in the embodiment of FIGS. 1A to 1C or in the embodiment of FIG. 3A. The support pattern 151 may have a shape substantially the same as that discussed in FIG. 3A. For example, the support pattern 151 may include a first supporter 152' and a second supporter 153'. In contrast, the support pattern 151 may include or may be formed of an intermetallic compound of the first and second metals.

For the semiconductor device of FIG. 3A or 3B, the first width W1, the second width W2, a height of the support pattern 151, a height of the solder pillar pattern 155, a height of the bump pattern 150, and a first pitch of the solder pillar patterns 155 may satisfy corresponding conditions explained in the examples of the first width W1, the second width W2, the height H1 of the support pattern 151, the height H3 of the solder pillar pattern 155, the height H2 of the bump pattern 150, and the first pitch P1 of the solder pillar patterns 155 that are discussed in FIGS. 1A to 1C.

FIGS. 4A to 4F illustrates cross-sectional views of section I of FIG. 1A taken along line II-III of FIG. 1B, showing a method of fabricating a semiconductor device according to some example embodiments. A duplicate description will be omitted below.

Figure 4A:
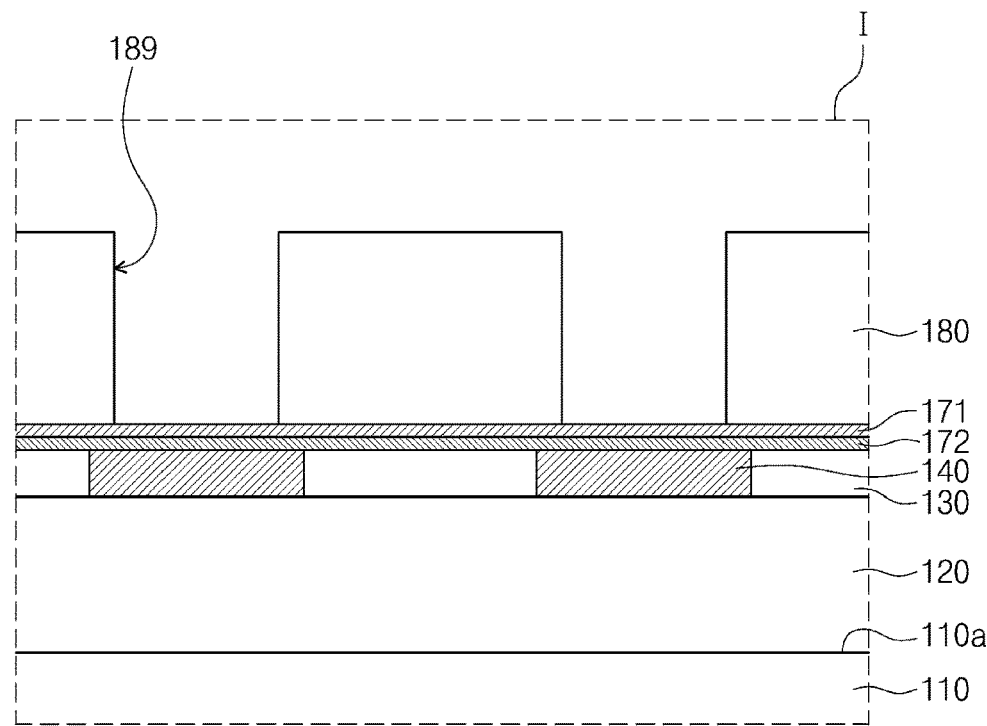
FIGS. 4A to 4F illustrate cross-sectional views showing a method of fabricating a semiconductor device according to some example embodiments.

Referring to FIG. 4A, a circuit layer 120, an under-bump pattern 140, and a protective layer 130 may be formed on a semiconductor substrate 110. A second seed layer 172 may be formed on and cover the under-bump pattern 140 and the protective layer 130. The second seed layer 172 may include or may be formed of metal different from first and second metals which will be discussed below. For example, the second seed layer 172 may include titanium. A first seed layer 171 may be formed on the second seed layer 172. The second seed layer 172 may serve as an adhesive layer. For example, the second seed layer 172 may cause the first seed layer 171 to normally combine with the under-bump pattern 140 and the protective layer 130. The first seed layer 171 may include or may be formed of a first metal.

A resist pattern 180 may be formed on the first seed layer 171. The resist pattern 180 may have a guide opening 189. The resist pattern 180 and its formation method may be substantially the same as those discussed above in FIG. 2A.

Figure 4B:
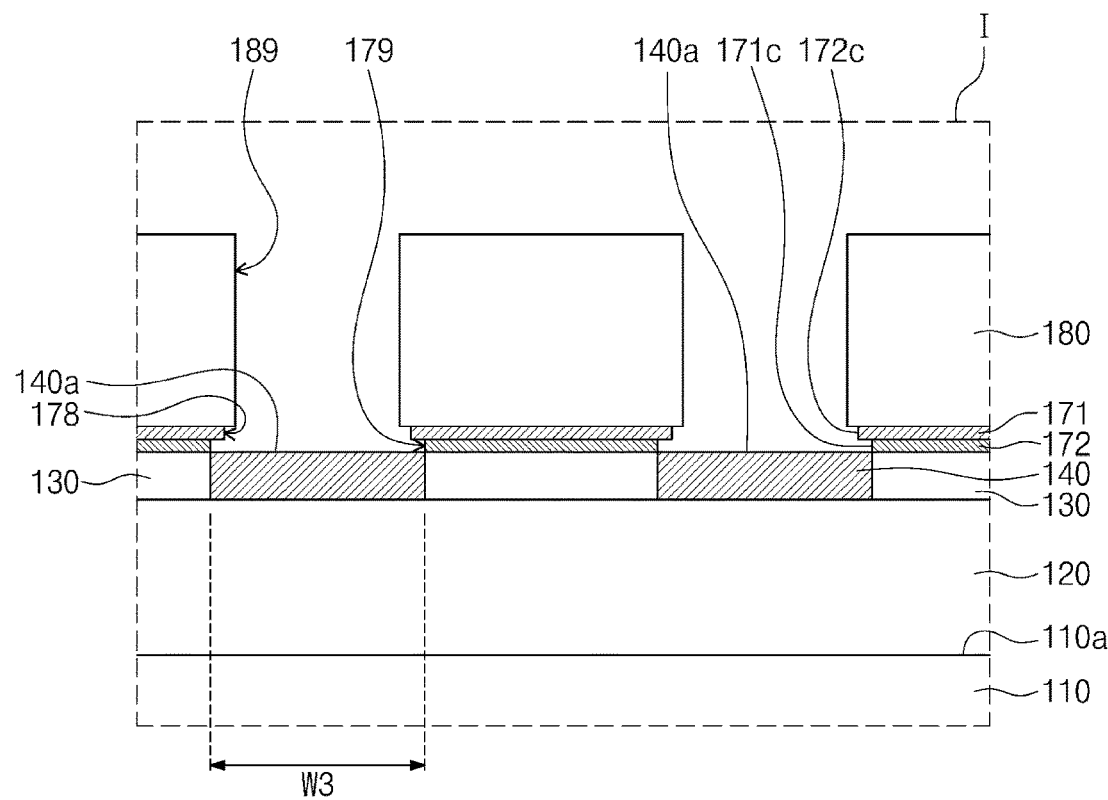

Referring to FIG. 4B, the first and second seed layers 171 and 172 may be partially removed to expose a top surface 140a of the under-bump pattern 140. The partial removal of the first seed layer 171 may include performing an etching process in the guide opening 189 to form a first opening 178 in the first seed layer 171. The first opening 178 may be spatially connected to the guide opening 189. The first opening 178 may have a width greater than that of the guide opening 189. Therefore, the first opening 178 may expose an inner sidewall 171c of the first seed layer 171 and a portion of a bottom surface of the resist pattern 180.

The partial removal of the second seed layer 172 may include performing an etching process in the guide opening 189 to form a second opening 179 in the second seed layer 172. The second opening 179 may expose a top surface 140a of the under-bump pattern 140 and an inner sidewall 172c of the second seed layer 172. The second opening 179 may be spatially connected to the first opening 178 and the guide opening 189. The second opening 179 may have a width greater than that of the first opening 178. The width of the second opening 179 may be the same as or less than a width W3 of the under-bump pattern 140.

For example, the etching process of the second seed layer 172 may be performed at etching conditions different from those at which the etching process of the first seed layer 171 is performed separately from the etching process of the second seed layer 172. For another example, the first and second seed layers 171 and 172 may be etched in a single etching process.

Figure 4C:
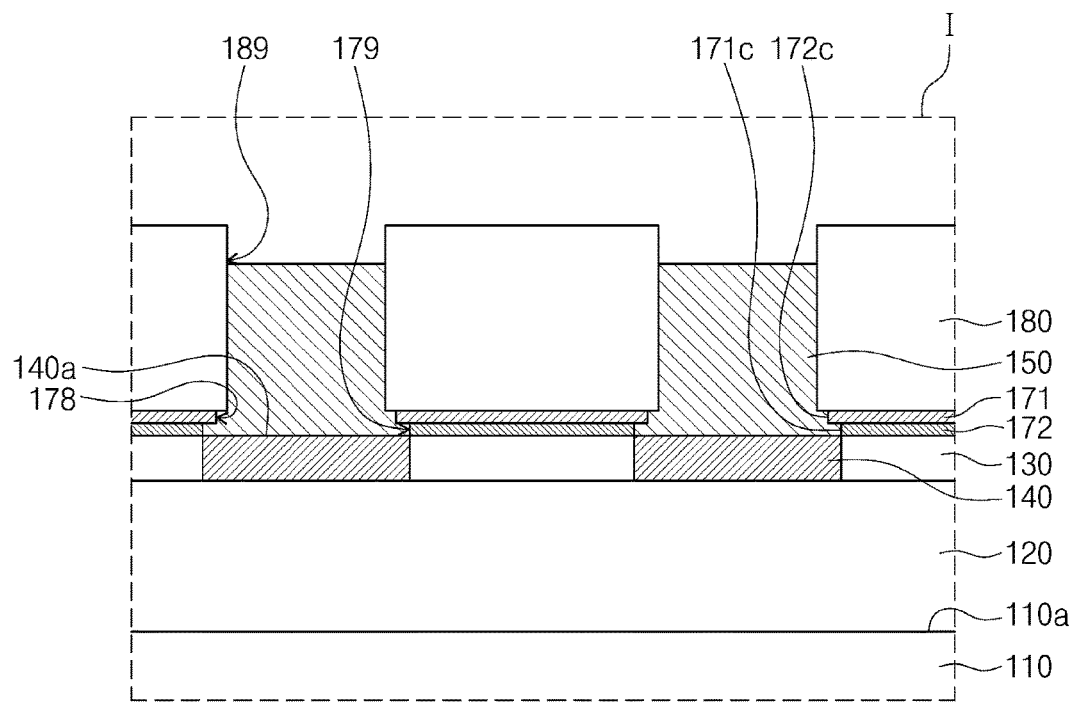

Referring to FIG. 4C, a bump pattern 150 may be formed in the guide opening 189 and on the exposed top surface 140a of the under-bump pattern 140. The formation of the bump pattern 150 may include performing an electroplating process in which at least one of the first seed layer 171, the second seed layer 172, and the under-bump pattern 140 is used as an electrode. The bump pattern 150 may fill the guide opening 189, and may contact the top surface 140a of the under-bump pattern 140, the inner sidewall 171c of the first seed layer 171, and the inner sidewall 172c of the second seed layer 172. The bump pattern 150 may include or may be formed of a second metal. The bump pattern 150 may include a support pattern 151 and a solder pillar pattern 155, and the support pattern 151 may include a first supporter 152 and a second supporter 153 (see FIG. 4D).

Figure 4D:
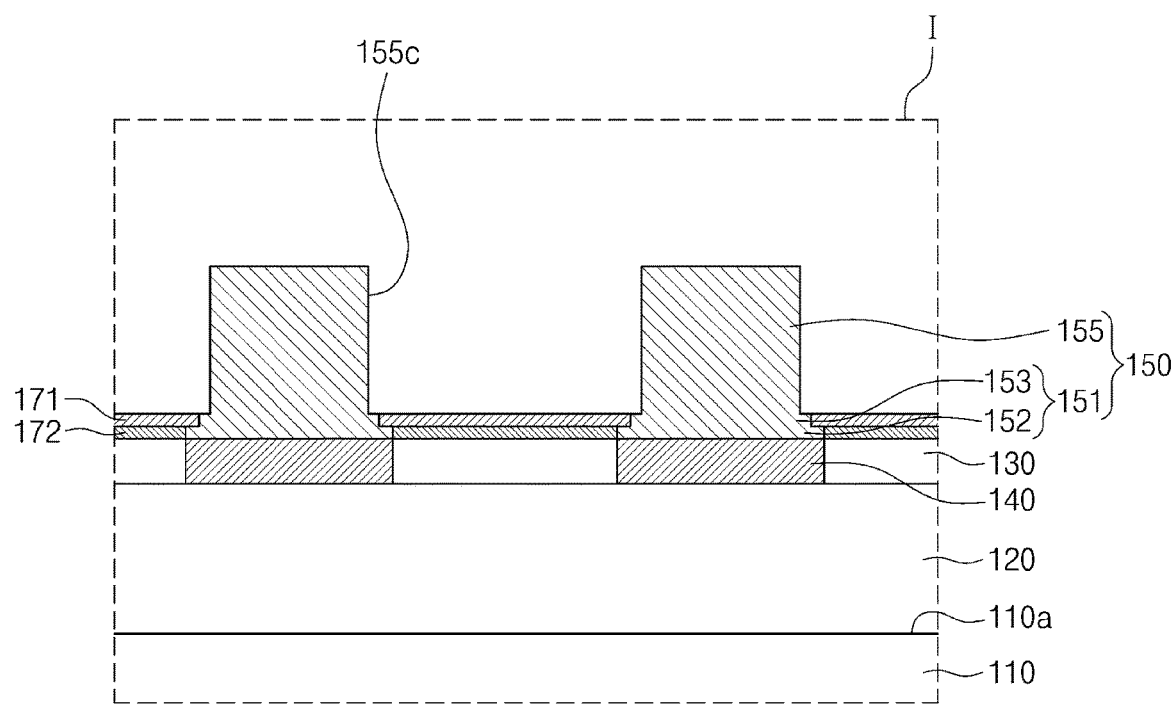

Referring to FIG. 4D, the resist pattern 180 may be removed to expose a top surface of the first seed layer 171 and a sidewall 155c of the solder pillar pattern 155.

Figure 4E:
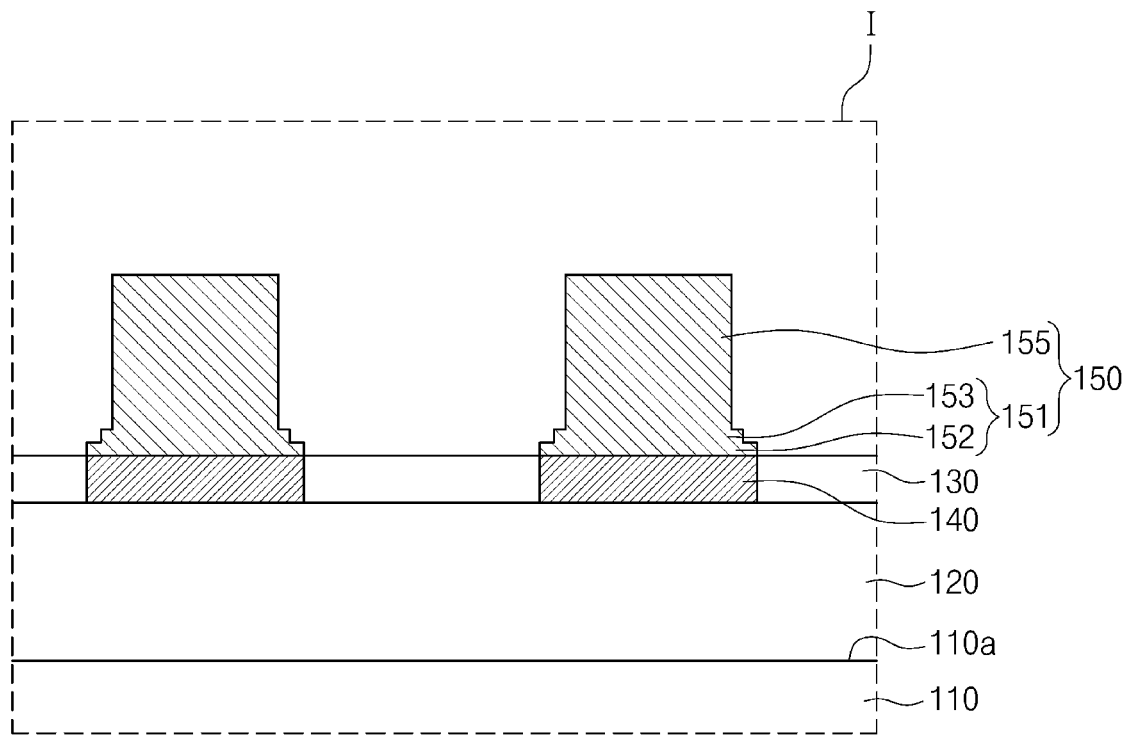

Referring to FIG. 4E, the first and second seed layers 171 and 172 may be removed to expose a top surface of the protective layer 130. The removal of the first seed layer 171 may include performing an etching process on the first seed layer 171. As a result of the etching process performed on the first seed layer 171, a top surface of the second seed layer 172 may be exposed. The removal of the second seed layer 172 may include performing an etching process on the exposed top surface of the second seed layer 172. As a result of the etching process performed on the second seed layer 172, a top surface of the protective layer 130 may be exposed.

During the etching processes of the first and second seed layers 171 and 172, the bump pattern 150 may have an etch selectivity with respect to the first and second seed layers 171 and 172. During the etching processes of the first and second seed layers 171 and 172, the bump pattern 150 may prevent the under-bump pattern 140 from being exposed to the etching processes. The etching process of the second seed layer 172 may be performed at etching conditions different from those at which the etching process of the first seed layer 171 is performed separately from the etching process of the second seed layer 172. Alternatively, the first and second seed layers 171 and 172 may be etched in a single etching process.

Figure 4F:
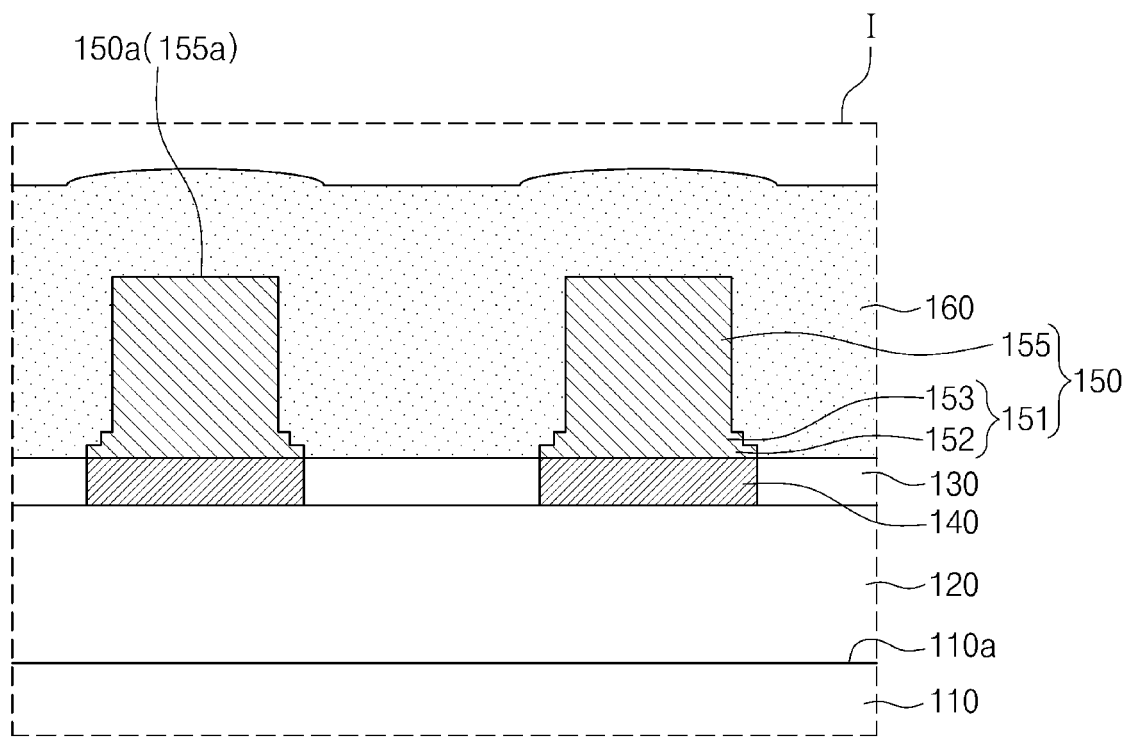

Referring to FIG. 4F, an organic dielectric layer 160 may be formed on the protective layer 130 and the bump pattern 150, and may cover the top surface of the protective layer 130, a sidewall of the bump pattern 150, and a first surface 150a of the bump pattern 150.

Referring back to FIG. 3A, the organic dielectric layer 160 may undergo a planarization process to expose a top surface 155a of the solder pillar pattern 155. As a result of the planarization process, the first surface 150a of the bump pattern 150 may become coplanar with a top surface 160a of the organic dielectric layer 160. Through the processes discussed above, a semiconductor device may be eventually fabricated.

Alternatively, the formation of the bump pattern 150 discussed in FIG. 4C may further include performing an annealing process on the bump pattern 150. The annealing process may be executed at the same condition as that discussed in the embodiment of FIG. 2D. As a result of the annealing process, the support pattern 151 may include or may be formed of an intermetallic compound. Afterwards, an organic dielectric layer 160 may be formed on the bump pattern 150, and then an annealing process may be performed to fabricate a semiconductor device of FIG. 3B.

The following will describe a semiconductor package and its fabrication method according to some example embodiments. In explaining semiconductor packages, top surfaces of some components may indicate bottom surfaces of related components discussed in FIGS. 1A to 4F, and bottom surfaces of some components may denote top surfaces of related components discussed in FIGS. 1A to 4F.

Figure 5A:
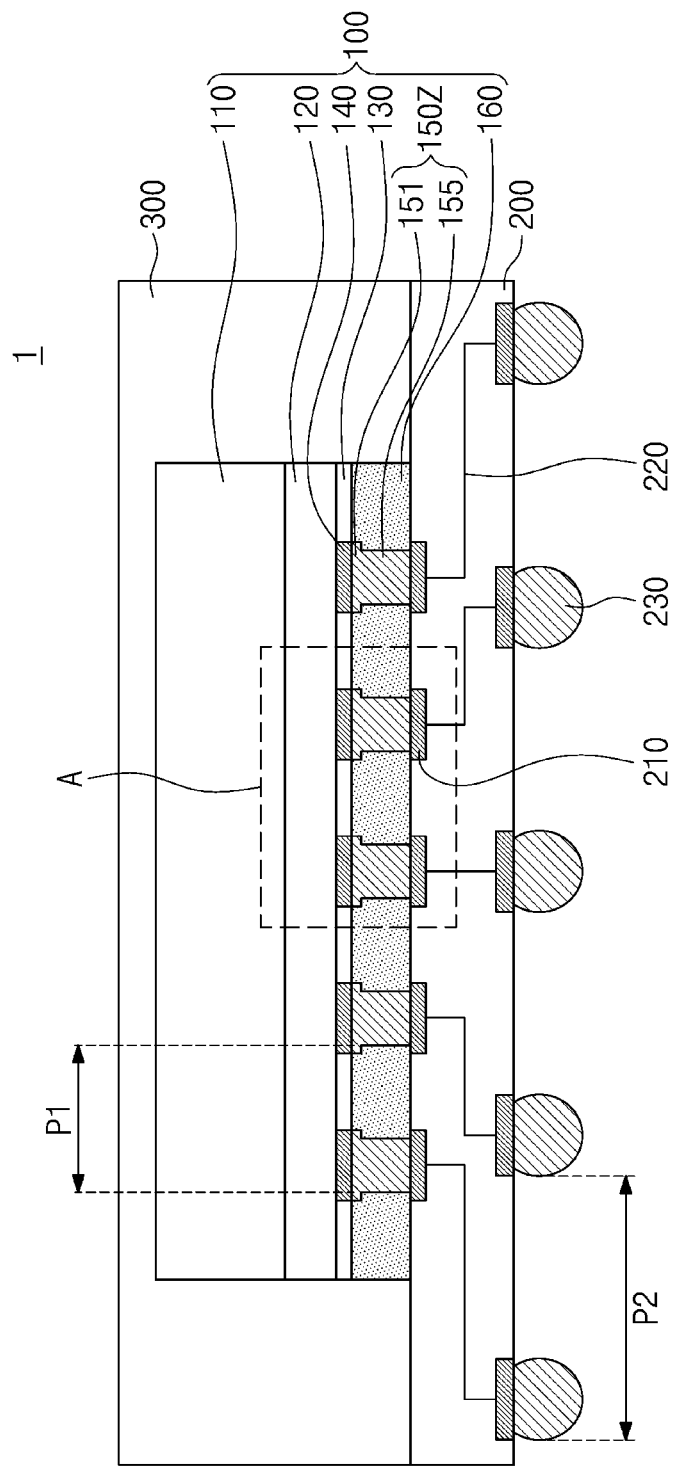
FIG. 5A illustrates a cross-sectional view showing a semiconductor package according to some example embodiments.
Figure 5B:
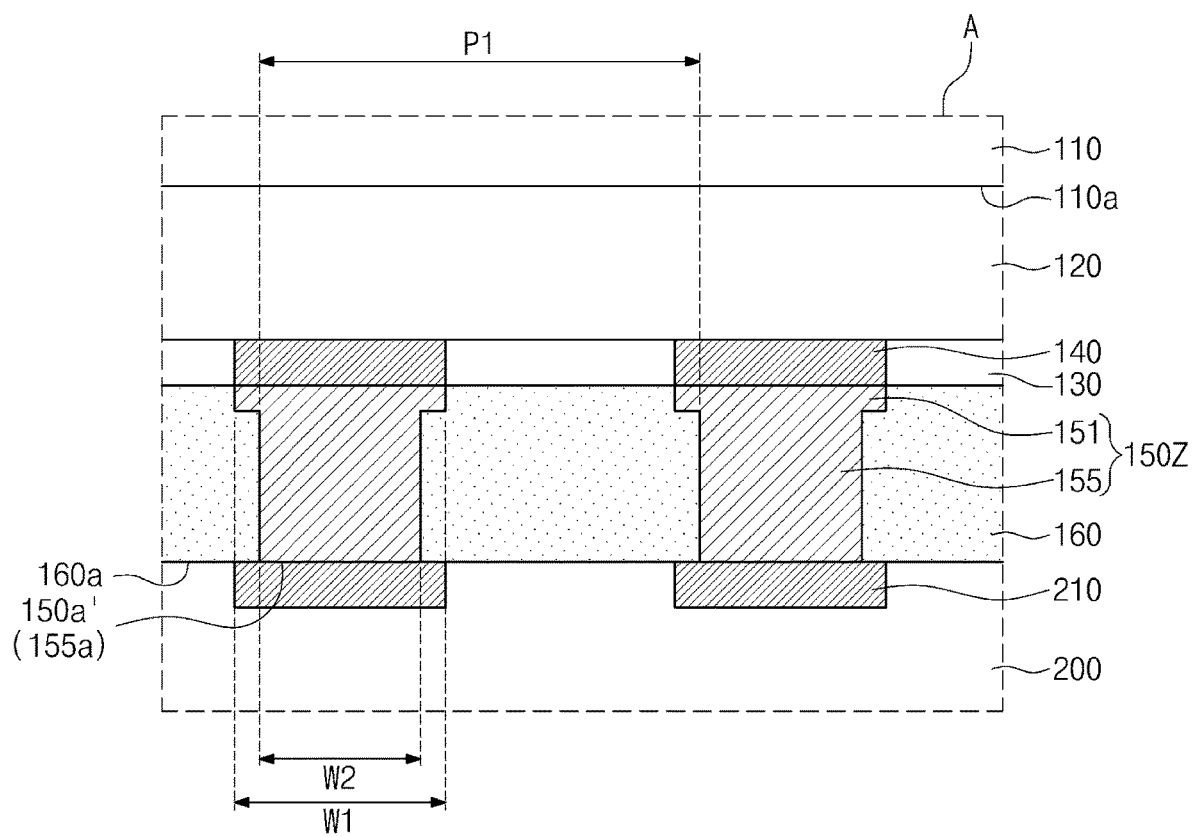
FIG. 5B illustrates an enlarged view showing section A of FIG. 5A.

FIG. 5A illustrates a cross-sectional view showing a semiconductor package according to some example embodiments. FIG. 5B illustrates an enlarged view showing section A of FIG. 5A. A duplicate description will be omitted below.

Referring to FIGS. 5A and 5B, a semiconductor package 1 may include a substrate and a semiconductor device 100. The substrate may include a package substrate 200. For example, the package substrate 200 may be a printed circuit board (PCB) with a circuit pattern. For another example, a redistribution layer may be used as the package substrate 200. The package substrate 200 may include a conductive pad 210, an internal connection line 220, and an external terminal 230. The external terminal 230 may be provided on a bottom surface of the package substrate 200. The external terminal 230 may include a solder ball or a bump. The external terminal 230 may include or may be formed of a conductive material. The internal connection line 220 may be disposed in the package substrate 200 and coupled to the external terminal 230. The internal connection line 220 may include a conductive material. The conductive pad 210 may be exposed on a top surface of the package substrate 200. The conductive pad 210 may include or may be formed of a third metal. The third metal may include, for example, copper. For another example, the third metal may include aluminum or tungsten. The third metal may include the same material as that of the first metal, but the present inventive concepts are not limited thereto. The conductive pad 210 may be electrically connected through the internal connection line 220 to the external terminal 230. In this description, the phrase "electrically connected to the package substrate 200" may mean that "electrically connected to the internal connection line 220." For brevity of illustration, the following figures except for FIG. 5A omit the internal connection line 220.

The semiconductor device 100 may be mounted on the package substrate 200. The semiconductor device 100 may include therein a connection bump pattern 150Z interposed between and coupled to the conductive pad 210 and the under-bump pattern 140. The semiconductor device 100 may have therein integrated circuits electrically connected through a plurality of connection bump patterns 150Z to the package substrate 200. The following will discuss the formation of the connection bump pattern 150Z and the mounting of the semiconductor device 100.

Figure 5C:
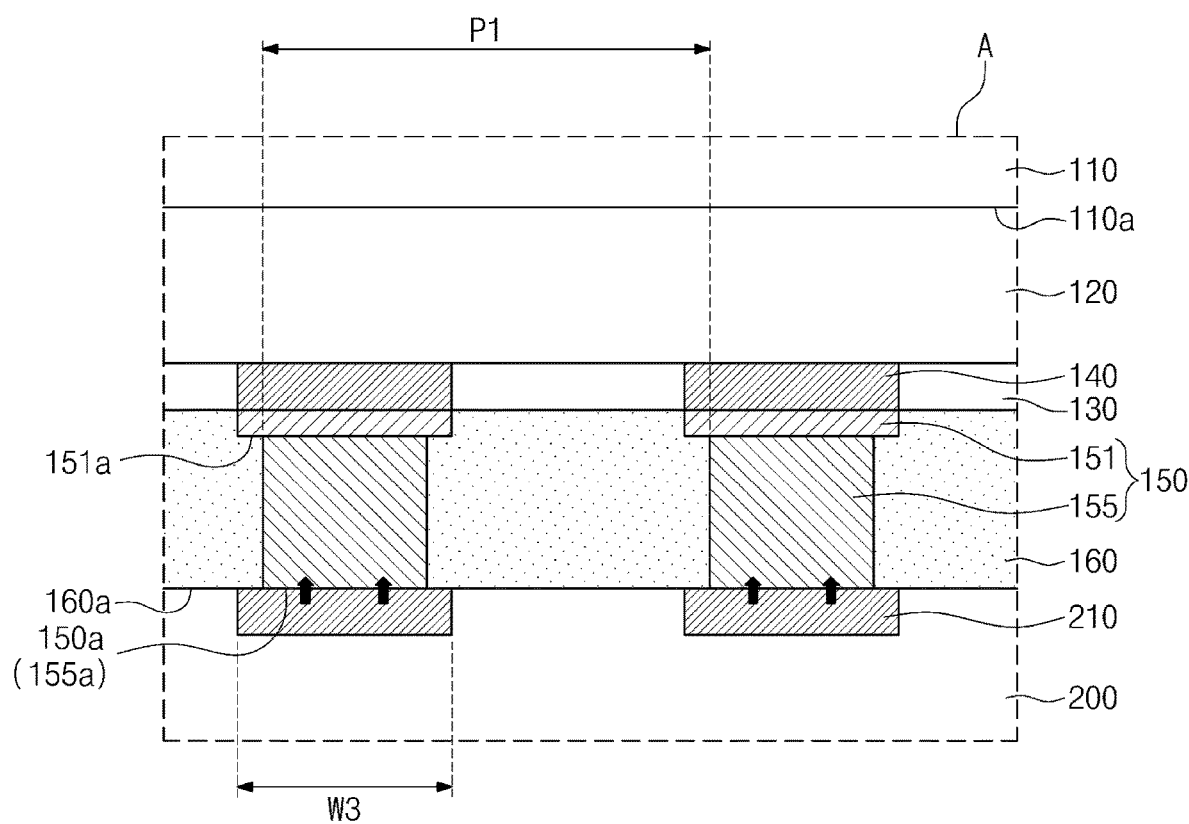
FIG. 5C illustrates a cross-sectional view showing the formation of a connection bump pattern and the mounting of a semiconductor device according to some example embodiments.

FIG. 5C illustrates an enlarged cross-sectional view of section A of FIG. 5A, showing the formation of a connection bump pattern and the mounting of a semiconductor device according to some example embodiments.

Referring to FIG. 5C together with FIGS. 5A and 5B, the semiconductor device 100 may be prepared. The semiconductor device 100 may be the same as the semiconductor device 100 discussed in FIGS. 1A to 1C. Alternatively, the semiconductor device of FIG. 1D may be used to fabricate the semiconductor package 1. The semiconductor device 100 may be disposed on the package substrate 200 such that the bump pattern 150 of the semiconductor device 100 is allowed to face the package substrate 200. The bump pattern 150 may be aligned with the conductive pad 210. The bump pattern 150 may have a first surface 150a in contact with the conductive pad 210. A soldering process may be performed on the bump pattern 150. The soldering process may be executed at a temperature greater than that at which the annealing process of the preliminary bump pattern 150P discussed in FIG. 2D is performed. For example, the soldering process may include thermally treating the bump pattern 150 at a temperature ranging from about 220° C. to about 250° C. Referring to FIG. 5C, when the soldering process is performed, as indicated by arrows, the third metal may diffuse from the conductive pad 210 into the solder pillar pattern 155. The third metal may meet a second metal in the solder pillar pattern 155, and thus the second and third metals may form an intermetallic compound. Therefore, the connection bump pattern 150Z may be formed as shown in FIG. 5B. The connection bump pattern 150Z may have a first surface 150a' in contact with the conductive pad 210. The first surface 150a' of the connection bump pattern 150Z may correspond to the first surface 150a of the bump pattern 150 discussed in FIGS. 1A to 1C. The connection bump pattern 150Z may include the support pattern 151 and the solder pillar pattern 155. The support pattern 151 may be substantially the same as the support pattern 151 discussed in FIGS. 1A to 1C. The solder pillar pattern 155 may have substantially the same shape as that discussed in FIGS. 1A to 1C. In contrast, the solder pillar pattern 155 may include or may be formed of an intermetallic compound of the second and third metals. When the third metal includes the same material as that of the first metal, the solder pillar pattern 155 may include or may be formed of the same intermetallic compound as that of the support pattern 151. The solder pillar pattern 155 may be connected to the support pattern 151 with no boundary therebetween.

The presence of the connection bump pattern 150Z may mount the semiconductor device 100 on the package substrate 200, and thus the semiconductor package 1 may be fabricated. The organic dielectric layer 160 may have a bottom surface 160a in physical contact with the top surface of the package substrate 200. The organic dielectric layer 160 may be interposed between the package substrate 200 and the protective layer 130 of the semiconductor device 100, and may encapsulate the connection bump pattern 150Z. Therefore, it may be possible to omit the formation of an under-fill layer. When the solder pillar pattern 155 flows down in the soldering process, a defective connection may be provided between the solder pillar pattern 155 and the conductive pad 210. Unlike an under-fill layer, the organic dielectric layer 160 may surround the solder pillar pattern 155 during the soldering process. The organic dielectric layer 160 may prevent the solder pillar pattern 155 from flowing down and being deformed in the soldering process. Accordingly, a favorable connection may be provided between the connection bump pattern 150Z and the conductive pad 210. In addition, the second width W2 and the first pitch P1 of the solder pillar pattern 155 may be relatively small. For example, as shown in FIG. 5A, the first pitch P1 may be less than pitch P2 between external terminals 230.

Referring back to FIG. 5A, a molding layer 300 may further be provided on the top surface of the package substrate 200. The molding layer 300 may cover a top surface and a sidewall of the semiconductor device 100. The molding layer 300 may include or may be formed of a dielectric polymer, such as an epoxy-based molding compound.

Figure 5D:
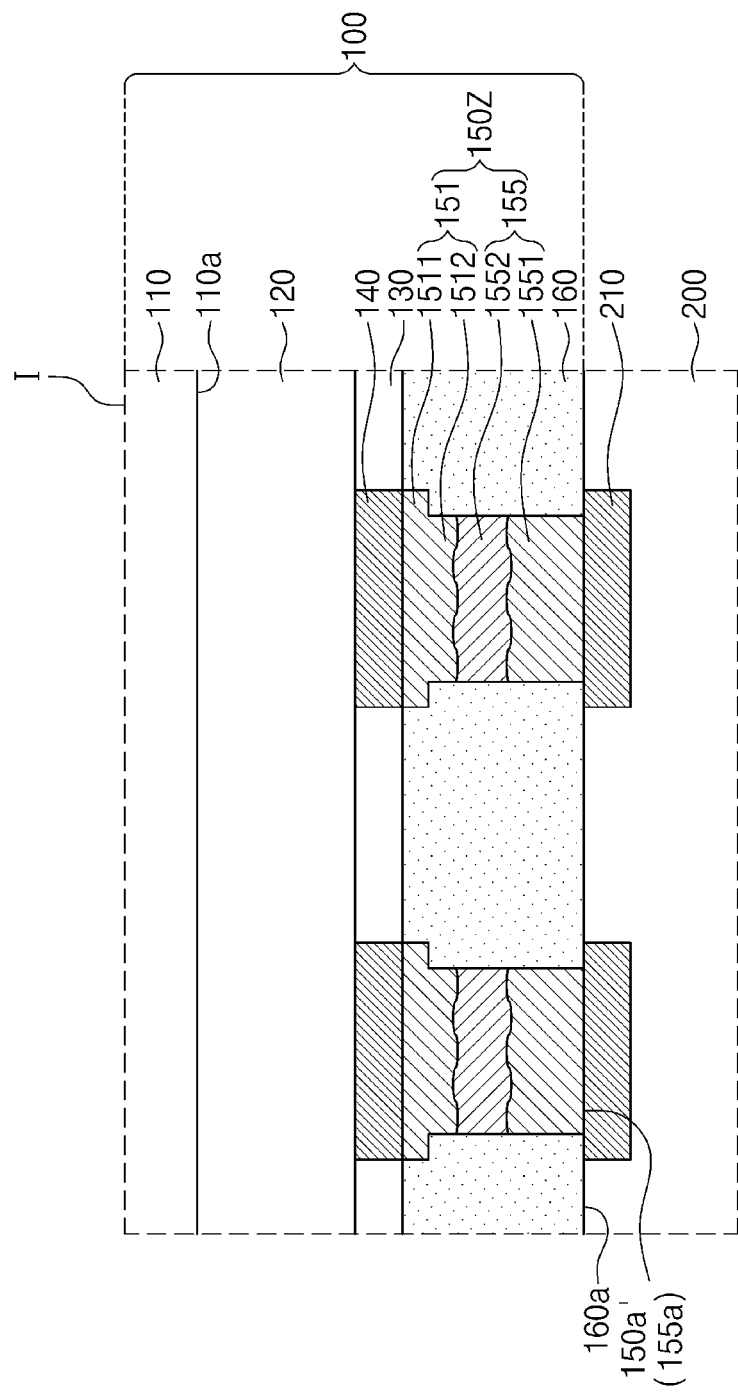
FIG. 5D illustrates a cross-sectional view showing a connection bump pattern according to some example embodiments.

FIG. 5D illustrates an enlarged cross-sectional view of section A of FIG. 5A, showing a connection bump pattern according to some example embodiments. A description of FIG. 5D below will also refer to FIG. 5A, and a repetitive explanation will be omitted.

Referring to FIG. 5D, the connection bump pattern 150Z may be interposed between and coupled to the under-bump pattern 140 and the conductive pad 210. The connection bump pattern 150Z may include the support pattern 151 and the solder pillar pattern 155. The support pattern 151 may include a first part 1511 and a second part 1512 as discussed in FIG. 1D. The first and second parts 1511 and 1512 may include or may be formed of an intermetallic compound of the first and second metals. The semiconductor device of FIG. 1D may be used to fabricate the semiconductor package 1 including the connection bump pattern 150Z. Alternatively, the semiconductor device 100 of FIGS. 1A to 1C may be used to fabricate a semiconductor package including the connection bump pattern 150Z. During the soldering process discussed in FIG. 5C, the first metal in the under-bump pattern 140 may migrate into the solder pillar pattern 155 to meet the first metal in the solder pillar pattern 155. Therefore, an intermetallic compound of the first and second metals may further be created, and the second part 1512 of the support pattern 151 may be formed.

The solder pillar pattern 155 may include a first part 1551 and a second part 1552. The first part 1551 of the solder pillar pattern 155 may be directly disposed on the conductive pad 210. The first part 1551 of the solder pillar pattern 155 may have a bottom surface 155a' in contact with the conductive pad 210. The bottom surface 155a' of the first part 1551 of the solder pillar pattern 155 may correspond to the first surface 150a' of the connection bump pattern 150Z. The first part 1551 of the solder pillar pattern 155 may include or may be formed of an intermetallic compound of the second and third metals.

The second part 1552 of the solder pillar pattern 155 may be interposed between the first part 1551 and the support pattern 151. The second part 1552 of the solder pillar pattern 155 may include or may be formed of the second metal, but may include no intermetallic compound. The second part 1552 of the solder pillar pattern 155 may correspond to a portion that does not participate in the formation of an intermetallic compound in the soldering process. The solder pillar pattern 155 may have the same shape as that discussed in FIGS. 1A to 1D.

Differently from that shown, there may be no formation of the second part 1552 of the solder pillar pattern 155 or no formation of the second part 1512 of the support pattern 151.

Figure 5E:
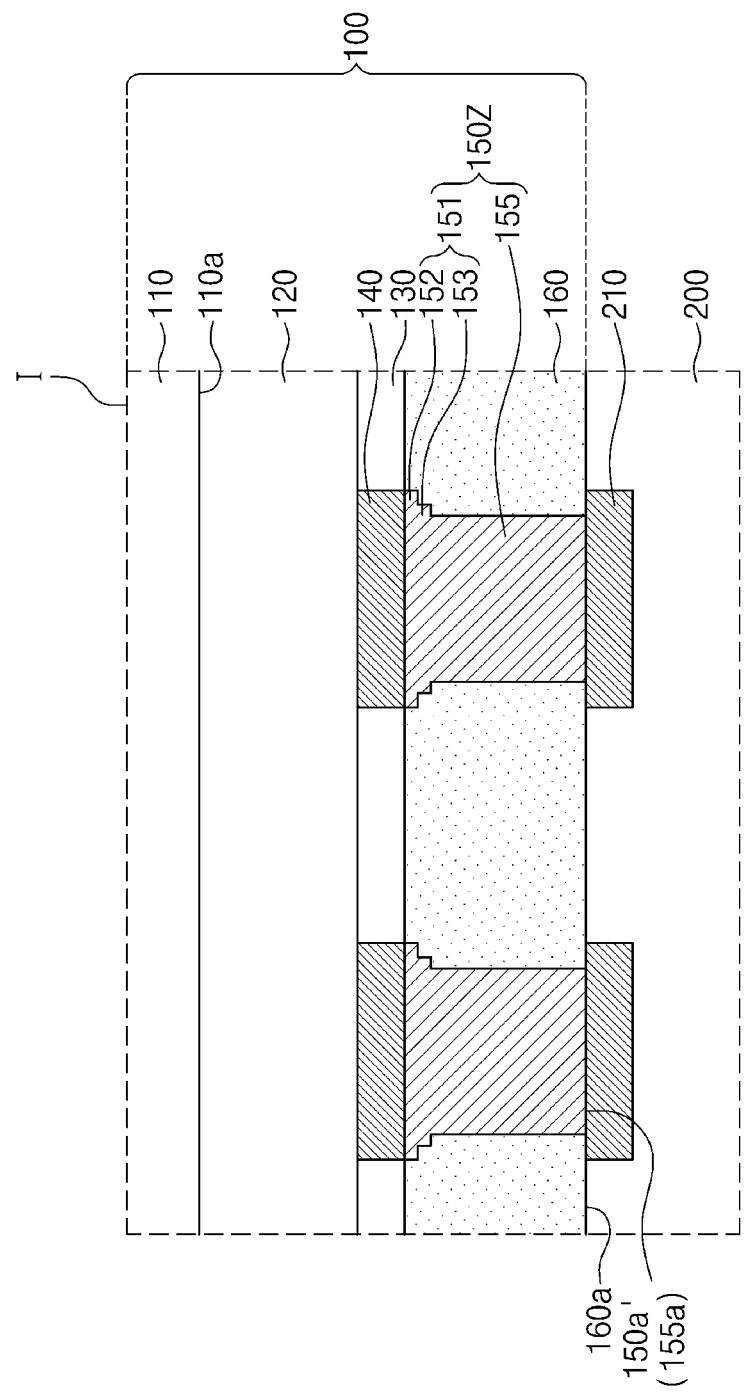
FIG. 5E illustrates a cross-sectional view showing a connection bump pattern according to some example embodiments.

FIG. 5E illustrates a cross-sectional view of section A of FIG. 5A, showing a connection bump pattern according to some example embodiments. A duplicate description will be omitted below.

Referring to FIG. 5E, the connection bump pattern 150Z may include the support pattern 151 and the solder pillar pattern 155. The support pattern 151 may include a first supporter 152 and a second supporter 153. The first and second supporters 152 and 153 may have their shapes the same as those discussed in FIG. 3A. The support pattern 151 may include or may be formed of an intermetallic compound of the first and second metals. The solder pillar pattern 155 may include an intermetallic compound of the second and third metals. When the third metal includes the same material as that of the first metal, the solder pillar pattern 155 may include or may be formed of the same intermetallic compound as that of the support pattern 151. The solder pillar pattern 155 may be connected to the support pattern 151 with no boundary therebetween. The solder pillar pattern 155 may have substantially the same shape as that of the solder pillar pattern 155 discussed in the embodiment of FIG. 3A.

The semiconductor device discussed in FIG. 3A or 3B may be used to fabricate a semiconductor package. The semiconductor package may include the connection bump pattern 150Z illustrated in figures.

Figure 5F:
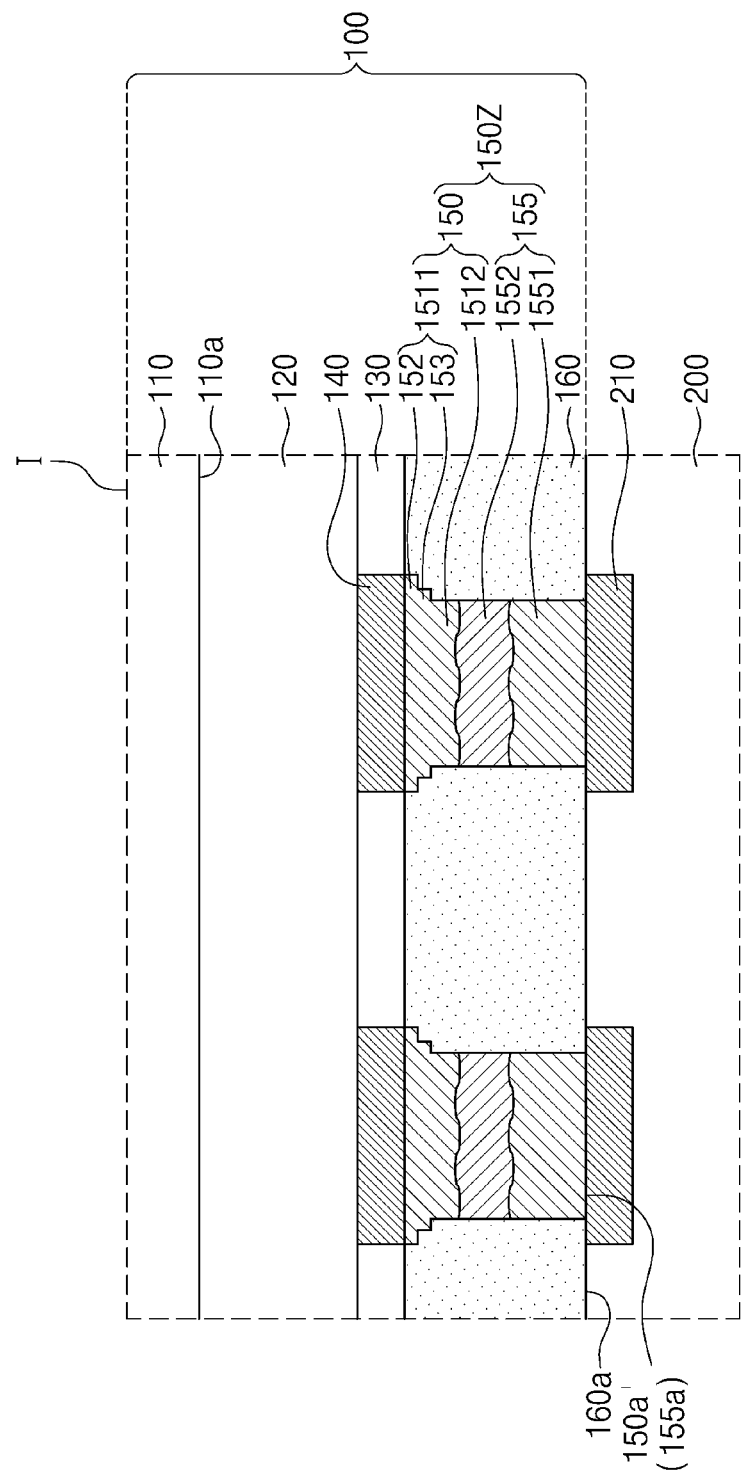
FIG. 5F illustrates a cross-sectional view showing a connection bump pattern according to some example embodiments.

FIG. 5F illustrates an enlarged cross-sectional view of section A of FIG. 5A, showing a connection bump pattern according to some example embodiments.

Referring to FIG. 5F, the connection bump patterns 150Z may include the support pattern 151 and the solder pillar pattern 155. The support pattern 151 may include a first part 1511 and a second part 1512. The first part 1511 of the support pattern 151 may include a first supporter 152 and a second supporter 153, and the first and second supporters 152 and 153 may be substantially the same as those discussed in FIG. 3B. The formation and material of the second part 1512 of the support pattern 151 may be substantially the same as those discussed in FIG. 5D. The first supporter 152, the second supporter 153, and the second part 1512 may include or may be formed of an intermetallic compound of the first and second metals. The second part 1512 of the support pattern 151 may be connected to the second supporter 153 with no boundary therebetween.

The solder pillar pattern 155 may include a first part 1551 and a second part 1552. The first and second parts 1551 and 1552 of the solder pillar pattern 155 may be the same as those discussed in FIG. 5D.

The semiconductor device discussed in FIG. 3A or 3B may be used to fabricate a semiconductor package including the connection bump pattern 150Z illustrated in figures.

For the connection bump patterns 150Z of FIGS. 5B, 5D, 5E, and 5F, a width of the support pattern 151, a width of the solder pillar pattern 155, a height of the support pattern 151, a height of the solder pillar pattern 155, a height of the connection bump pattern 150Z, and a first pitch of the solder pillar patterns 155 may satisfy corresponding conditions explained in the examples of the first width W1, the second width W2, the height H1 of the support pattern 151, the height H3 of the solder pillar pattern 155, the height H2 of the bump pattern 150, and the first pitch P1 of the solder pillar patterns 155 that are discussed in FIGS. 1A to 1C.

Figure 6A:
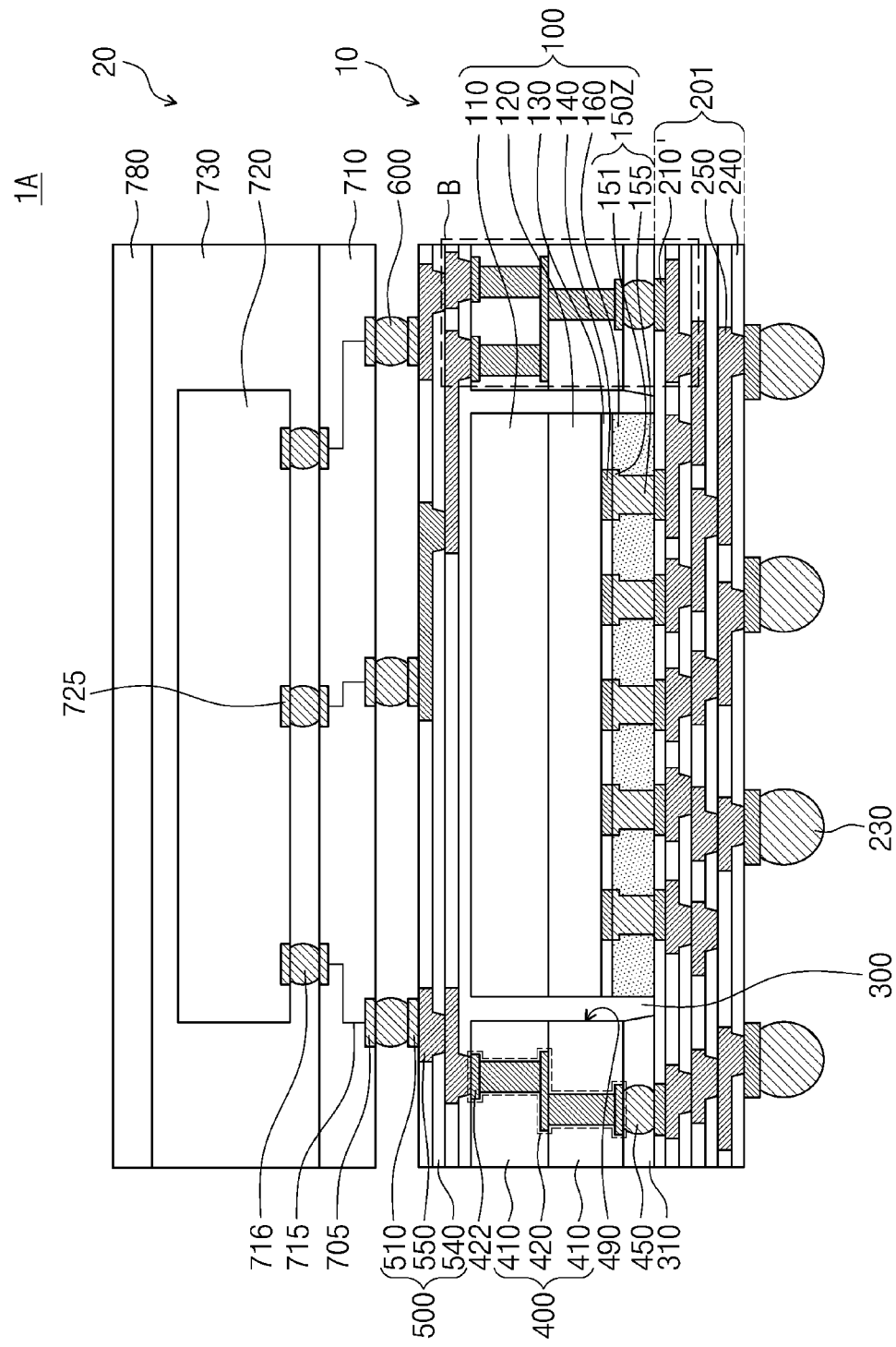
FIG. 6A illustrates a cross-sectional view showing a semiconductor package according to some example embodiments.
Figure 6B:
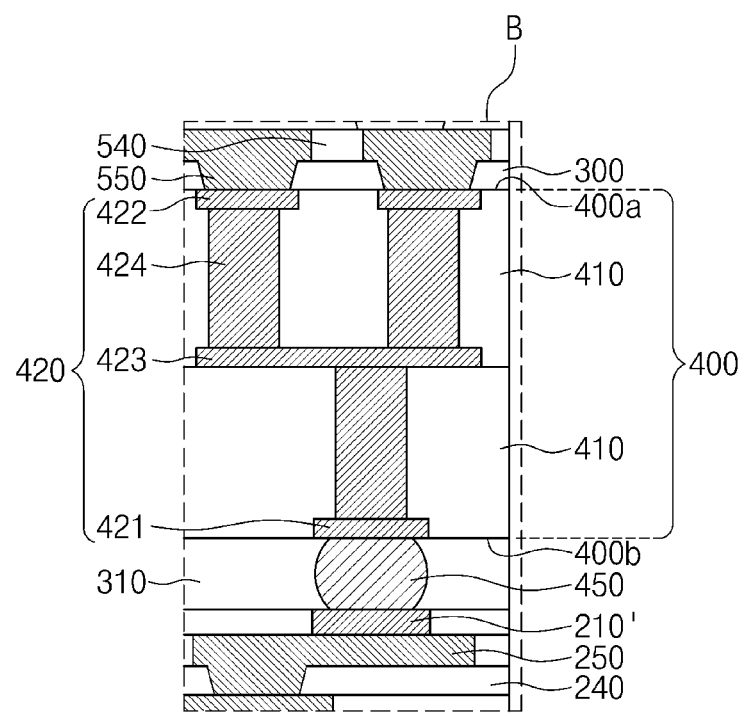
FIG. 6B illustrates an enlarged view showing section B of FIG. 6A.

FIG. 6A illustrates a cross-sectional view showing a semiconductor package according to some example embodiments. FIG. 6B illustrates an enlarged view showing section B of FIG. 6A.

Referring to FIGS. 6A and 6B, a semiconductor package 1A may include a first semiconductor package 10 and a second semiconductor package 20. The first semiconductor package 10 may include a substrate, a semiconductor device 100, a connection substrate 400, and a molding layer 300. The substrate may be a redistribution substrate 201. The redistribution substrate 201 may include a dielectric pattern 240, a redistribution pattern 250, and a conductive pad 210'. The redistribution pattern 250 may have substantially the same function as that of the internal connection line 220 discussed in FIG. 5A. The redistribution pattern 250 may include or may be formed of a conductive material, such as metal. The dielectric pattern 240 may include a photosensitive polymer. The conductive pads 210' may include or may be formed of a third metal.

The formation of the redistribution substrate 201 may include coating the dielectric pattern 240 on a carrier substrate, forming an opening in the dielectric pattern 240, forming a conductive layer on the dielectric pattern 240 and in the opening, and patterning the conductive pattern to form the redistribution pattern 250. The formation of the dielectric pattern 240 may be performed repeatedly, and likewise the formation of the redistribution pattern 250 may also be performed repeatedly. Therefore, the redistribution substrate 201 may include a plurality of dielectric patterns 240. The redistribution pattern 250 may be disposed in or between the dielectric patterns 240. The redistribution pattern 250 may include a line part and a via part. The conductive pad 210' may be formed on or in an uppermost dielectric pattern 240 and coupled to the redistribution pattern 250. After the formation of the redistribution substrate 201, the carrier substrate may be removed to expose a bottom surface of the redistribution substrate 201. External terminals 230 may be formed on the exposed bottom surface of the redistribution substrate 201 and coupled to the redistribution pattern 250.

The connection substrate 400 may be disposed on the redistribution substrate 201. The connection substrate 400 may have a hole 490 that penetrates therethrough. For example, the hole 490 may be formed to penetrate top and bottom surfaces of a printed circuit board, and the printed circuit board having the hole 490 may be used as the connection substrate 400. When viewed in plan, the hole 490 may be formed on a central portion of the redistribution substrate 201. The connection substrate 400 may include a base layer 410 and a conductive structure 420. The base layer 410 may include a plurality of stacked base layers. The base layers 410 may include a dielectric material. For example, the base layers 410 may include carbon-based materials, ceramics, or polymers. The hole 490 may penetrate the base layers 410. The conductive structure 420 may be provided in the base layers 410. As illustrated in FIG. 6B, the conductive structure 420 may include a first pad 421, a conductive line 423, vias 424, and a second pad 422. The first pad 421 may be exposed on a bottom surface 400b of the connection substrate 400. The conductive line 423 may be interposed between the base layers 410. The vias 424 may penetrate the base layers 410 and may be coupled to the conductive line 423. The second pad 422 may be exposed on a top surface 400a of the connection substrate 400 and may be coupled to one of the vias 424. The second pad 422 may be electrically connected to the first pad 421 through the vias 424 and the conductive line 423. The second pad 422 may not be vertically aligned with the first pad 421. The number of second pads 422 may be different from the number of first pads 421. The conductive structure 420 may include or may be formed of metal. The conductive structure 420 may include, for example, at least one of copper, aluminum, gold, lead, stainless steels, silver, iron, and alloys thereof.

A conductive bump 450 may be interposed between the redistribution substrate 201 and the connection substrate 400. The conductive bump 450 may be interposed between and coupled to the conductive pad 210' and the first pad 421. The conductive structure 420 may be electrically connected through the conductive bump 450 to the redistribution substrate 201. In this description, the phrase "electrically connected to the redistribution substrate 201" may mean that "electrically connected to the redistribution pattern 250." The conductive bump 450 may include at least one of a solder ball, a bump, and a pillar. The conductive bump 450 may include or may be formed of a metallic material. An under-fill pattern 310 may be provided in a gap between the redistribution substrate 201 and the connection substrate 400, and may encapsulate the conductive bump 450.

As shown in FIG. 6A, the semiconductor device 100 may be mounted on the redistribution substrate 201. The semiconductor device 100 may be provided in the hole 490 of the connection substrate 400. The semiconductor device 100 may be disposed spaced apart from an inner sidewall of the connection substrate 400. A method substantially the same as that discussed in FIG. 5C may be performed to mount the semiconductor device 100. For example, the semiconductor device 100 may be placed on the package substrate 200 to allow an exposed first surface of the bump pattern 150 to have a contact with the conductive pad 210'. A soldering process may be performed on the bump pattern 150 to form a connection bump pattern 150Z. The connection bump pattern 150Z may be coupled to the conductive pad 210'. Integrated circuits of the semiconductor device 100 may be electrically connected through the connection bump pattern 150Z to the redistribution pattern 250. The connection bump pattern 150Z may include the support pattern 151 and the solder pillar pattern 155 as discussed in the embodiment of FIG. 5B, 5E, or 5F. An organic dielectric layer 160 may physically contact a top surface of the redistribution substrate 201. For example, the organic dielectric layer 160 may have a bottom surface in physical contact with a top surface of the uppermost dielectric pattern 240. The organic dielectric layer 160 may be interposed between the redistribution substrate 201 and the protective layer 130, and may encapsulate the connection bump pattern 150Z.

External terminals 230 may be provided on the bottom surface of the redistribution substrate 201. A first subset of the external terminals 230 may be coupled through the redistribution pattern 250 to the semiconductor device 100, and a second subset of the external terminals 230 may be electrically connected through the redistribution pattern 250 to the conductive structure 420.

The molding layer 300 may be provided on the semiconductor device 100 and the connection substrate 400. The molding layer 300 may extend into a gap between the semiconductor device 100 and the connection substrate 400, and thus the gap may be filled with the molding layer 300. The molding layer 300 may include a dielectric polymer, such as an epoxy-based polymer. In some example embodiments, an adhesive dielectric film may be attached to a top surface of the connection substrate 400, a top surface of the semiconductor device 100, and a sidewall of the semiconductor device 100, thereby forming the molding layer 300. For example, an Ajinomoto build-up film (ABF) may be used as the adhesive dielectric film. In some example embodiments, the under-fill pattern 310 may be omitted, and the molding layer 300 may further extend into a gap between the redistribution substrate 201 and the connection substrate 400.

The first semiconductor package 10 may further include an upper redistribution layer 500. The upper redistribution layer 500 may be disposed on the molding layer 300. The upper redistribution layer 500 may include upper dielectric patterns 540, an upper redistribution pattern 550, and an upper conductive pad 510. The upper dielectric patterns 540 may be stacked on the connection substrate 400 and the molding layer 300. The upper dielectric patterns 540 may include a photosensitive polymer. The upper redistribution pattern 550 may include one or more via parts in the upper dielectric patterns 540 and one or more line parts between the upper dielectric patterns 540. The upper redistribution pattern 550 may include or may be formed of metal, such as copper. The upper redistribution pattern 550 may extend into the molding layer 300 and may be coupled to the second pad 422. The upper conductive pad 510 may be disposed on an uppermost one of the upper dielectric patterns 540 and coupled to the upper redistribution pattern 550. The upper conductive pad 510 may be electrically connected through the upper redistribution pattern 550 and the conductive structure 420 to the external terminal 230 or the semiconductor device 100. The presence of the upper redistribution pattern 550 may not permit a vertical alignment between the upper conductive pad 510 and the second pad 422.

The second semiconductor package 20 may be disposed on the first semiconductor package 10. For example, the second semiconductor package 20 may be placed on the upper redistribution layer 500. The second semiconductor package 20 may include an upper substrate 710, an upper semiconductor chip 720, and an upper molding layer 730. The upper substrate 710 may be a printed circuit board. Alternatively, the upper substrate 710 may be a redistribution layer. For example, the formation of the upper substrate 710 may be the same as or similar to that of the redistribution substrate 201 discussed above. A connection pad 705 may be disposed on a bottom surface of the upper substrate 710. The connection pad 705 may include or may be formed of a conductive material, such as metal.

The upper semiconductor chip 720 may be disposed on the upper substrate 710. The upper semiconductor chip 720 may include integrated circuits, and the integrated circuits may include a memory circuit, a logic circuit, or a combination thereof. The upper semiconductor chip 720 may be of a different type from that of the semiconductor device 100. A bump terminal 716 may be interposed between the upper substrate 710 and the upper semiconductor chip 720. A chip pad 725 of the upper semiconductor chip 720 may be electrically connected to the connection pad 705 through the bump terminal 716 and a connection line 715 in the upper substrate 710. Although not illustrated, alternatively, the chip pad 725 may be directly coupled to a pad on the upper substrate 710. FIG. 6E schematically shows the connection line 715, and the connection line 715 may be variously changed in shape and arrangement. The upper molding layer 730 may be provided on the upper substrate 710 and may cover the upper semiconductor chip 720. The upper molding layer 730 may include a dielectric polymer, such as an epoxy-based polymer.

The second semiconductor package 20 may further include a thermal radiation structure 780. The thermal radiation structure 780 may include a heat sink, a heat slug, or a thermal interface material (TIM) layer. The thermal radiation structure 780 may include or may be formed of, for example, metal. The thermal radiation structure 780 may be disposed on a top surface of the upper molding layer 730. The thermal radiation structure 780 may extend onto a sidewall of the upper molding layer 730 or a sidewall of the molding layer 300.

A connection terminal 600 may be interposed between and coupled to the upper conductive pad 510 and the connection pad 705. In such a configuration, the second semiconductor package 20 may be electrically connected through the connection terminal 600 to the semiconductor device 100 and the external terminal 230. The electrical connection of the second semiconductor package 20 may include an electrical connection with integrated circuits in the upper semiconductor chip 720.

Alternatively, the upper substrate 710 may be omitted, and the connection terminal 600 may be directly coupled to the upper conductive pad 510 and the chip pad 725 of the upper semiconductor chip 720. In this case, the connection terminal 600 may be substantially the same as the connection bump pattern 150Z of FIG. 5B, 5D, 5E, or 5F. In addition, the upper molding layer 730 may contact a top surface of the upper redistribution layer 500. Alternatively, the upper redistribution layer 500 may be omitted, and the connection terminal 600 may contact the second pad 422.

Figure 7:
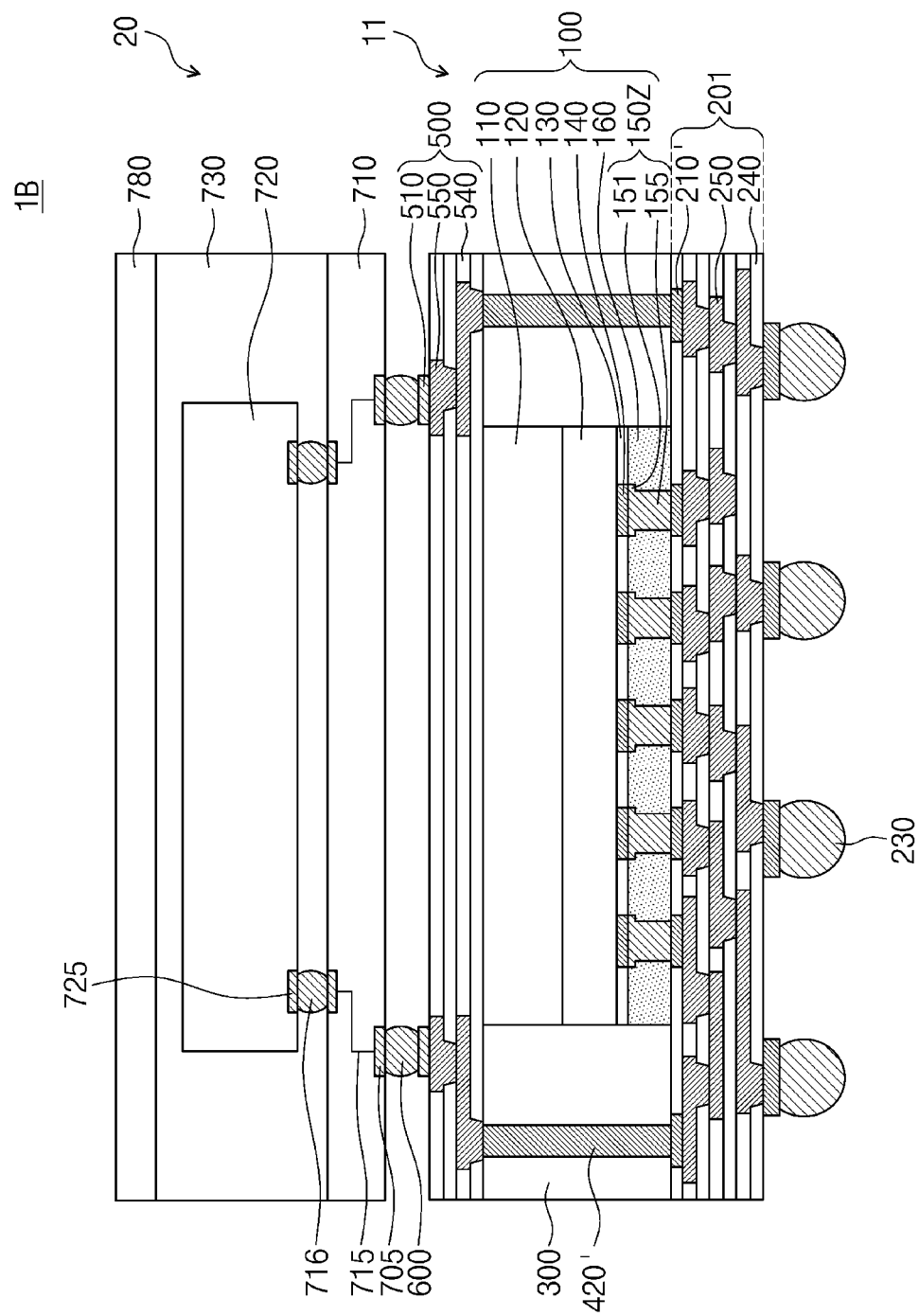
FIG. 7 illustrates a cross-sectional view showing a semiconductor package according to some example embodiments.

FIG. 7 illustrates a cross-sectional view showing a semiconductor package according to some example embodiments. A duplicate description will be omitted below.

Referring to FIG. 7, a semiconductor package 1B may include a first semiconductor package 11 and a second semiconductor package 20. The first semiconductor package 11 may include the redistribution substrate 201, the semiconductor device 100, and the molding layer 300, and may further include a conductive structure 420'. The semiconductor device 100 may be coupled through the connection bump pattern 150Z to the redistribution substrate 201. The under-bump pattern 140 may include the support pattern 151 and the solder pillar pattern 155 as discussed in the embodiment of FIG. 5B, 5E, or 5F. The organic dielectric layer 160 may physically contact a top surface of the redistribution substrate 201. Although not illustrated, a plurality of semiconductor devices 100 may be provided. In this case, the semiconductor devices 100 may be disposed laterally spaced apart from each other.

The connection substrate 400 discussed in FIGS. 6A and 6B may not be provided. Instead of the connection substrate 400, a metal pillar may be provided on the redistribution substrate 201 and may form the conductive structure 420'. For example, the conductive structure 420' may include the metal pillar. The conductive structure 420' may be spaced apart from the semiconductor device 100. The conductive structure 420' may be electrically connected to the redistribution substrate 201.

The molding layer 300 may be provided on the redistribution substrate 201 and may cover the semiconductor device 100. The molding layer 300 may encapsulate a sidewall of the conductive structure 420', but may expose a top surface of the conductive structure 420'.

The upper redistribution layer 500 may be substantially the same as the upper redistribution layer 500 of FIGS. 5A and 5B. For example, the upper redistribution layer 500 may include the upper dielectric patterns 540, the upper redistribution pattern 550, and the upper conductive pad 510. The upper redistribution pattern 550 may contact the top surface of the conductive structure 420' and may have an electrical connection with the conductive structure 420'. Alternatively, the first semiconductor package 11 may not include the upper redistribution layer 500.

The second semiconductor package 20 may include the upper semiconductor chip 720 and the upper molding layer 730. The second semiconductor package 20 may further include the upper substrate 710. The thermal radiation structure 780 discussed in FIG. 6A may further be provided on the upper molding layer 730. The connection terminal 600 may be provided between the first semiconductor package 11 and the second semiconductor package 20. The connection terminal 600 may be substantially the same as that discussed above in FIG. 5A.

Figure 8A:
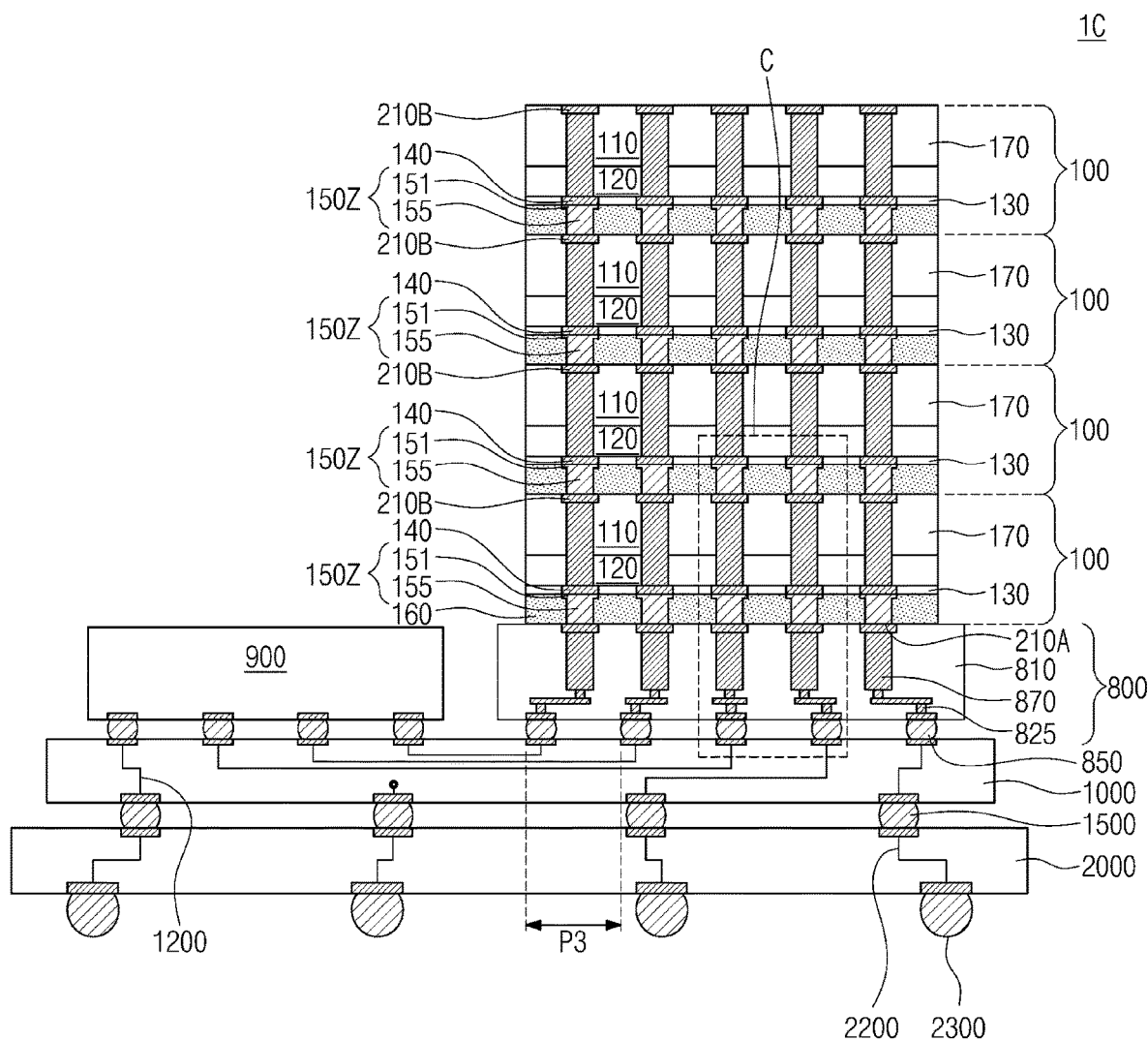
FIG. 8A illustrates a cross-sectional view showing a semiconductor package according to some example embodiments.
Figure 8B:
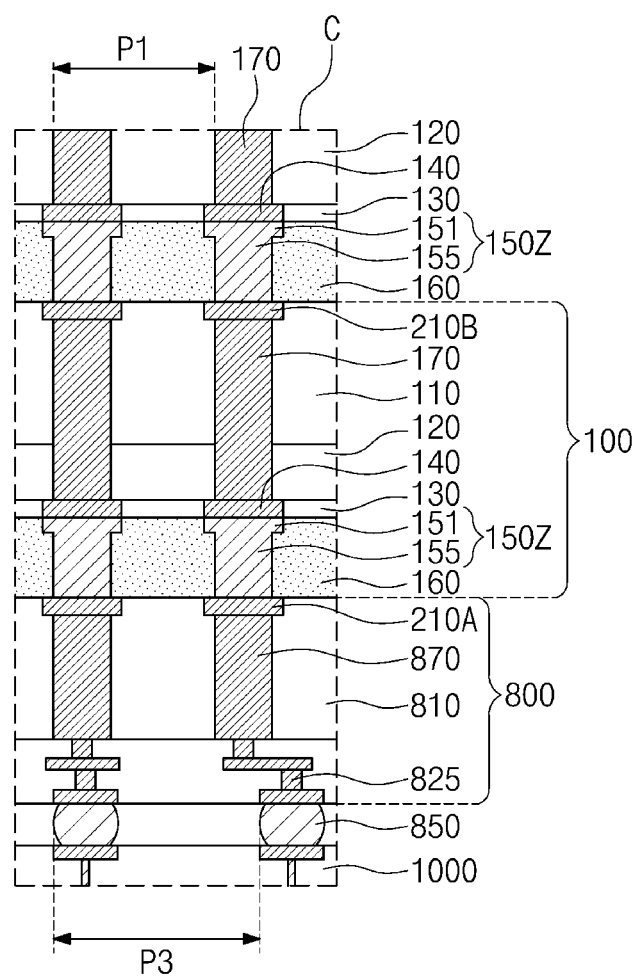
FIG. 8B illustrates an enlarged view showing section C of FIG. 8A.

FIG. 8A illustrates a cross-sectional view showing a semiconductor package according to some example embodiments. FIG. 8B illustrates an enlarged view showing section C of FIG. 8A. A duplicate description will be omitted below.

Referring to FIGS. 8A and 8B, a semiconductor package 1C may include a substrate 2000, an interposer substrate 1000, a first semiconductor chip 800, a plurality of semiconductor devices 100, and a second semiconductor chip 900. The semiconductor package 1C may be a high bandwidth memory (HBM) package.

The substrate 2000 may include a printed circuit board. The substrate 2000 may include a metal line 2200 therein. External conductive terminals 2300 may be provided on a bottom surface of the substrate 2000 and coupled to the metal lines 2200. External electrical signals may be transmitted through the external conductive terminals 2300 to the metal lines 2200. Solder balls may be used as the external conductive terminals 2300. The external conductive terminals 2300 may include or may be formed of metal, such as a solder material.

The interposer substrate 1000 may be disposed on the substrate 2000. The interposer substrate 1000 may include a conductive line pattern 1200 therein. The phrase "a certain component is coupled to the interposer substrate 1000" may mean that "a certain component is coupled to the conductive line pattern 1200." An interposer terminal 1500 may be provided between the interposer substrate 1000 and the substrate 2000. The interposer terminal 1500 may be coupled to the metal line 2200 and the conductive line pattern 1200. The interposer terminal 1500 may include a solder ball or a bump. The interposer terminal 1500 may include or may be formed of a metallic material.

The first semiconductor chip 800 may be disposed on a top surface of the interposer substrate 1000. Integrated circuits (not shown) of the first semiconductor chip 800 may include logic circuits, and the first semiconductor chip 800 may serve as a logic chip. The first semiconductor chip 800 may include a base substrate 810, first through vias 870, connection structures 825, and first conductive pads 210A. The base substrate 810 may be a semiconductor substrate. The first through vias 870 may penetrate the base substrate 810. At least one of the first through vias 870 may be coupled to the integrated circuits of the first semiconductor chip 800. The first conductive pads 210A may be exposed on a top surface of the first semiconductor chip 800. The connection structures 825 may be interposed between the first through vias 870 and the first conductive pads 210A. The connection structures 825 may each include a via part and a line part. The connection structures 825 may include or may be formed of a conductive material, such as metal. The first conductive pads 210A may be coupled through the connection structures 825 to corresponding first through vias 870. The first conductive pads 210A may include, for example, a third metal.

Conductive terminals 850 may be provided between the first semiconductor chip 800 and the interposer substrate 1000. The integrated circuits of the first semiconductor chip 800 and the first through vias 870 may be coupled through the conductive terminals 850 to the interposer substrate 1000. The conductive terminals 850 may include solder balls or bumps. The conductive terminals 850 may include or may be formed of a conductive material, such as metal.

The semiconductor devices 100 may be stacked on the first semiconductor chip 800. According to some example embodiments, integrated circuits of each of the semiconductor devices 100 may include memory circuits. Each of the semiconductor devices 100 may be a high bandwidth memory chip. Each of the semiconductor devices 100 may include the semiconductor substrate 110, the circuit layer 120, the protective layer 130, the under-bump pattern 140, the organic dielectric layer 160, and the connection bump pattern 150Z. The semiconductor substrate 110, the circuit layer 120, the protective layer 130, the under-bump pattern 140, the organic dielectric layer 160, and the connection bump pattern 150Z may be substantially the same as those discussed in FIGS. 5A to 5F. The connection bump pattern 150Z of FIG. 5B are illustrated for convenience, but the present inventive concepts are not limited thereto. For example, the connection bump pattern 150Z may include the support pattern 151 and the solder pillar pattern 155 as discussed in the embodiment of FIG. 5B, 5E, or 5F.

Each of the semiconductor devices 100 may further include a second through via 170 and a second conductive pad 210B. The second through via 170 may penetrate the semiconductor substrate 110. The second through via 170 may further penetrate at least a portion of the circuit layer 120. The second conductive pad 210B may be disposed on a top surface of each semiconductor device 100 and coupled to the second through via 170. The second conductive pad 210B may include or may be formed of a third metal. Differently from that shown, an uppermost semiconductor device 100 may include neither the second through via 170 nor the second conductive pad 210B.

The connection bump pattern 150Z of a lowermost semiconductor device 100 may be coupled to the first conductive pad 210A of the first semiconductor chip 800. For example, the first conductive pad 210A may contact a bottom surface of the solder pillar pattern 155 of the connection bump pattern 150Z included in the lowermost semiconductor device 100. The connection bump pattern 150Z of the lowermost semiconductor device 100 may include or may be formed of an intermetallic compound of the second and third metals. The organic dielectric layer 160 of the lowermost semiconductor device 100 may contact the top surface of the first semiconductor chip 800 and may encapsulate the connection bump pattern 150Z of the lowermost semiconductor device 100.

Each of the semiconductor devices 100 may include a plurality of connection bump patterns 150Z. The connection bump patterns 150Z may act as electrical pathways between neighboring semiconductor devices 100. For example, the semiconductor devices 100 may include a lower semiconductor device and an upper semiconductor device that neighbor each other. In this case, the upper semiconductor device may be disposed on a top surface of the lower semiconductor device. The connection bump patterns 150Z of the upper semiconductor device may be coupled to the second conductive pad 210B of the lower semiconductor device. The solder pillar patterns 155 of the connection bump patterns 150Z included in the upper semiconductor device may include or may be formed of an intermetallic compound of the second and third metals. The organic dielectric layer 160 of the upper semiconductor device may encapsulate the connection bump patterns 150Z. The organic dielectric layer 160 of the upper semiconductor device may contact a top surface of the semiconductor substrate 110 included in the lower semiconductor device.

The first pitch P1 between the connection bump patterns 150Z may be less than a pitch P3 between the conductive terminals 850. The pitch P3 between the conductive terminals 850 may be less than a pitch between the external conductive terminals 2300.

On the interposer substrate 1000, the second semiconductor chip 900 may be disposed laterally spaced apart from the first semiconductor chip 800. The second semiconductor chip 900 may include a central processing unit (CPU) or a graphic processing unit (GPU). The second semiconductor chip 900 may be electrically connected through the conductive line 1200 of the interposer substrate 1000 to the first semiconductor chip 800 or the semiconductor devices 100.

According to some example embodiments of the present inventive concepts, a bump pattern may be disposed on an under-bump pattern and may include a support pattern and a solder pillar pattern. The support pattern may contact the under-bump pattern. The support pattern may have a width greater than that of the solder pillar pattern, and thus an increased contact area may be provided between the under-bump pattern and the bump pattern. Therefore, the under-bump pattern and the bump pattern may have an increased adhesive force therebetween. A semiconductor device may increase in durability and reliability.

The solder pillar pattern may have a small width and a narrow pitch. Accordingly, a semiconductor device may increase in performance and may decrease in size.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A method of manufacturing semiconductor device, the method comprising:
   forming an under-bump pattern and a protective layer on a semiconductor substrate;
   forming a seed layer on the under-bump pattern and the protective layer;
   forming a resist pattern comprising a guide opening on the seed layer, the guide opening exposing at least a portion of a top surface of the seed layer which overlaps the under-bump pattern;
   forming a preliminary bump pattern in the guide opening of the resist pattern; and
   performing an annealing process to the preliminary bump pattern.

2. The method of claim 1, wherein the annealing process is performed at a temperature ranging from about 160° C. to about 220° C.

3. The method of claim 1, further comprising,
   performing etching process to a portion of the seed layer overlapping the protective layer after the annealing process.

4. The method of claim 3, wherein the seed layer includes a material that have an etch selectivity with respect to the preliminary bump pattern.

5. The method of claim 1, wherein a width of the guide opening is less than a width of the under-bump pattern.

6. The method of claim 1, wherein a solder pillar pattern is formed from the preliminary bump pattern as a result of the annealing process,
   further comprising,
   forming an organic dielectric layer covering a lateral surface and a top surface of the solder pillar pattern.

7. The method of claim 6, further comprising,
   performing planarization process to the organic dielectric layer until the top surface of the solder pillar pattern is exposed.

8. The method of claim 6,
   wherein a support pattern is formed from a portion of the seed layer overlapping the under-bump pattern as a result of the annealing process, and
   wherein a width of the support pattern is greater than a width of the solder pillar pattern.

9. The method of claim 8, wherein the support pattern contacts the solder pillar pattern.

10. The method of claim 1, wherein forming the preliminary bump pattern comprises performing an electroplating process in which the seed layer is used as an electrode.

11. A method of manufacturing semiconductor device, the method comprising:
    forming an under-bump pattern and a protective layer on a semiconductor substrate;
    forming a first seed layer on the under-bump pattern and the protective layer;
    forming a second seed layer on the first seed layer;
    forming a resist pattern comprising a guide opening on the second seed layer, the guide opening exposing at least a portion of a top surface of the second seed layer which overlaps the under-bump pattern;
    forming a first opening in the second seed layer by performing a first etching process in the guide opening of the resist pattern;
    forming a second opening in the first seed layer by performing a second etching process in the first opening; and
    forming a bump pattern on the under-bump pattern.

12. The method of claim 11, wherein a width of the first opening and a width of the second opening is greater than a width of the guide opening.

13. The method of claim 12, wherein the width of the second opening is greater than the width of the first opening and is less than a width of the under-bump pattern.

14. The method of claim 12, wherein the second opening exposes an entire top surface of the under-bump pattern.

15. The method of claim 11, further comprising, removing the first seed layer and the second seed layer by performing a third etching process after forming the bump pattern.

16. The method of claim 15, wherein the bump pattern comprises a material that have an etch selectivity with respect to the first seed layer and the second seed layer.

17. The method of claim 11, wherein forming the bump pattern includes performing an electroplating process in which at least one of the first seed layer, the second seed layer, and the under-bump pattern is used as an electrode.

18. The method of claim 17, wherein the bump pattern contacts the under-bump pattern.

19. A method of manufacturing semiconductor device, the method comprising:
    forming a circuit layer on a semiconductor substrate;
    forming an under-bump pattern and a protective layer on the circuit layer, the protective layer exposing at least a portion of a top surface of the under-bump pattern;
    forming a seed layer on the under-bump pattern and the protective layer;
    forming a resist pattern comprising a guide opening on the seed layer;
    forming a preliminary bump pattern in the guide opening of the resist pattern, the preliminary bump pattern including a material different from that of the under-bump pattern;
    forming a bump pattern on the preliminary bump pattern by performing an annealing process on the preliminary bump pattern;
    forming an organic dielectric layer covering a lateral surface and a top surface of the bump pattern; and
    performing a planarization process with respect to the organic dielectric layer until an upper surface of the bump pattern is exposed,
    wherein the bump pattern comprises a support pattern which is formed from a portion of the seed layer and a solder pillar pattern which is formed from a portion of the preliminary bump pattern.

20. The method of claim 19, wherein the planarization process includes a grinding process or a fly-cut process.

* * * * *